(12) United States Patent
Kim et al.

(10) Patent No.: US 12,382,685 B2
(45) Date of Patent: Aug. 5, 2025

(54) SEMICONDUCTOR DEVICES

(71) Applicant: Samsung Electronics Co., Ltd., Suwon-si (KR)

(72) Inventors: Gyeom Kim, Suwon-si (KR); Jinbum Kim, Suwon-si (KR); Sangmoon Lee, Suwon-si (KR); Dahye Kim, Suwon-si (KR); Kyungbin Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 504 days.

(21) Appl. No.: 18/073,806

(22) Filed: Dec. 2, 2022

(65) Prior Publication Data
US 2023/0317792 A1 Oct. 5, 2023

(30) Foreign Application Priority Data
Apr. 4, 2022 (KR) ........................ 10-2022-0041579

(51) Int. Cl.
| | |
|---|---|
| *H01L 29/423* | (2006.01) |
| *H01L 29/06* | (2006.01) |
| *H01L 29/08* | (2006.01) |
| *H01L 29/167* | (2006.01) |
| *H01L 29/417* | (2006.01) |
| *H01L 29/775* | (2006.01) |
| *H10D 30/43* | (2025.01) |
| *H10D 30/67* | (2025.01) |
| *H10D 62/10* | (2025.01) |

(Continued)

(52) U.S. Cl.
CPC .......... *H10D 62/151* (2025.01); *H10D 30/43* (2025.01); *H10D 30/6729* (2025.01); *H10D 30/6735* (2025.01); *H10D 62/121* (2025.01); *H10D 62/834* (2025.01)

(58) Field of Classification Search
CPC .. H10D 62/151; H10D 30/43; H10D 30/6729; H10D 30/6735; H10D 62/121; H10D 62/834; H10D 30/014; H10D 30/6757; H10D 62/822; H10D 62/832; H10D 64/017; H10D 64/256; H10D 84/834; H10D 64/251; B82Y 10/00
USPC ......................................................... 257/347
See application file for complete search history.

(56) References Cited

U.S. PATENT DOCUMENTS

| | | | |
|---|---|---|---|
| 7,834,345 B2 | 11/2010 | Bhuwalka et al. | |
| 8,598,003 B2 | 12/2013 | Murtthy et al. | |

(Continued)

*Primary Examiner* — Tong-Ho Kim
(74) *Attorney, Agent, or Firm* — Muir Patent Law, PLLC

(57) ABSTRACT

A semiconductor device includes an active region, a plurality of channel layers disposed to be spaced apart from each other in a vertical direction on the active region, a gate structure extending in a second direction to intersect the active region and the plurality of channel layers and surrounding the plurality of channel layers, a source/drain region disposed on the active region on at least one side of the gate structure and contacting the plurality of channel layers, and a contact plug connected to the source/drain region. The source/drain region includes a first epitaxial layer disposed on the active region and extending to contact the plurality of channel layers, second epitaxial layers disposed on the first epitaxial layer, each including impurities in a first concentration, and doping layers stacked alternately with the second epitaxial layers, each including the impurities in a second concentration higher than the first concentration.

20 Claims, 24 Drawing Sheets

(51) Int. Cl.
  *H10D 62/13* (2025.01)
  *H10D 62/834* (2025.01)

(56) References Cited

U.S. PATENT DOCUMENTS

| | | |
|---|---|---|
| 8,778,767 B2 | 7/2014 | Huang et al. |
| 9,543,439 B2 | 1/2017 | Liao et al. |
| 10,446,652 B2 | 10/2019 | Li |
| 10,490,661 B2 | 11/2019 | Ma et al. |
| 10,593,761 B1 | 3/2020 | Takeuchi et al. |
| 2014/0246710 A1 | 9/2014 | Tsai et al. |
| 2020/0020774 A1* | 1/2020 | Lee ............ H10D 62/121 |
| 2020/0168723 A1* | 5/2020 | Hsu ............ H10D 30/024 |

* cited by examiner

SEMICONDUCTOR DEVICES

CROSS-REFERENCE TO RELATED APPLICATION(S)

This application claims benefit of priority to Korean Patent Application No. 10-2022-0041579 filed on Apr. 4, 2022 in the Korean Intellectual Property Office, the disclosure of which is incorporated herein by reference in its entirety.

BACKGROUND

The present inventive concept relates to semiconductor devices.

As the demand for high performance, high speed, and multifunctionality in semiconductor devices has increased, the degree of integration of semiconductor devices has increased. With the trend for high-density semiconductor devices, transistors in semiconductor devices are increasingly scaled down and there is ongoing research into methods of forming transistors having reduced sizes. To address limitations of operating characteristics caused by a decrease in sizes of planar metal oxide semiconductor field effect transistors (MOSFETs), various efforts have been made to develop semiconductor devices including FinFETs with a channel having a 3-dimensional structure.

SUMMARY

Example embodiments provide a semiconductor device having improved electrical characteristics.

According to an example embodiment, a semiconductor device includes: an active region extending in a first direction on a substrate; a plurality of channel layers disposed to be spaced apart from each other in a vertical direction, perpendicular to an upper surface of the substrate, on the active region; a gate structure extending in a second direction to intersect the active region and the plurality of channel layers on the substrate and surrounding each of the plurality of channel layers; a source/drain region disposed on the active region on at least one side of the gate structure and contacting the plurality of channel layers; and a contact plug connected to the source/drain region. The source/drain region includes: a first epitaxial layer disposed on the active region and extending to contact the plurality of channel layers; second epitaxial layers disposed on the first epitaxial layer, each second epitaxial layer including impurities in a first concentration and having a first thickness; and doping layers stacked alternately with the second epitaxial layers, each doping layer including the impurities in a second concentration higher than the first concentration and having a second thickness less than the first thickness. Side surfaces of each of the second epitaxial layers and each of the doping layers contact the first epitaxial layer, and the contact plug contacts at least a portion of the doping layers.

According to an example embodiment, a semiconductor device includes: an active region extending in a first direction on a substrate; a plurality of channel layers disposed to be spaced apart from each other in a vertical direction, perpendicular to an upper surface of the substrate, on the active region; a gate structure intersecting the active region and the plurality of channel layers and extending in a second direction on the substrate and surrounding each of the plurality of channel layers; a source/drain region disposed on the active region on at least one side of the gate structure and contacting the plurality of channel layers; and a contact plug connected to the source/drain region. The source/drain region includes: a first epitaxial layer disposed on the active region and extending to contact the plurality of channel layers; second epitaxial layers disposed on the first epitaxial layer, each second epitaxial layer including impurities in a first concentration and having a first thickness; and doping layers stacked alternately with the second epitaxial layers, each doping layer including the impurities in a second concentration and having a second thickness less than the first thickness. Among the second epitaxial layers, the lowermost second epitaxial layer covers an entire internal side surface of the first epitaxial layer, and the contact plug contacts at least a portion of the doping layers.

According to an example embodiment, a semiconductor device includes: an active region extending in a first direction on a substrate; a gate structure intersecting the active region and extending in a second direction on the substrate; a source/drain region disposed on the active region on at least one side of the gate structure; and a contact plug connected to the source/drain region. The source/drain region includes: epitaxial layers each having a first thickness; and doping layers stacked alternately with the epitaxial layers, each doping layer including at least one of phosphorus (P), arsenic (As), boron (B), gallium (Ga), antimony (Sb), aluminum (Al), thallium (Tl), and indium (In) in an impurity concentration of about $1 \times 10^{19}$ atoms/cm$^3$ to about $1 \times 10^{22}$ atoms/cm$^3$, and having a second thickness less than the first thickness. The contact plug contacts at least a portion of the doping layers.

BRIEF DESCRIPTION OF DRAWINGS

The above and other aspects, features, and advantages of the present inventive concept will be more clearly understood from the following detailed description, taken in conjunction with the accompanying drawings.

DETAILED DESCRIPTION

Hereinafter, example embodiments will be described with reference to the accompanying drawings.

Figure 1:
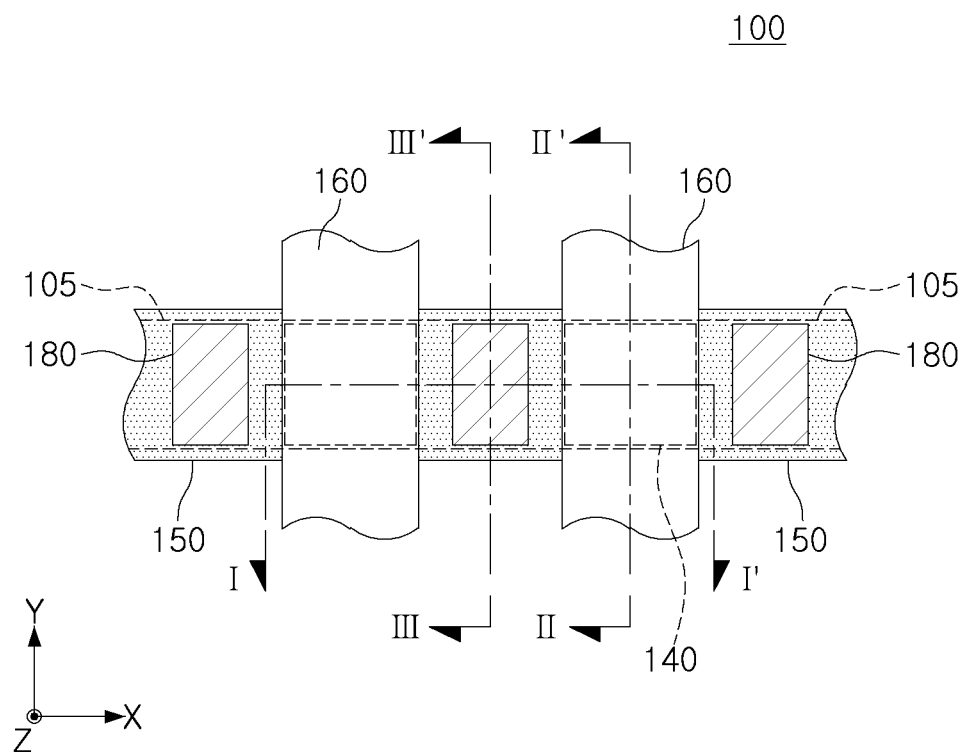
FIG. 1 is a plan view illustrating a semiconductor device according to example embodiments.

FIG. 1 is a plan view illustrating a semiconductor device according to example embodiments.

Figure 2A:
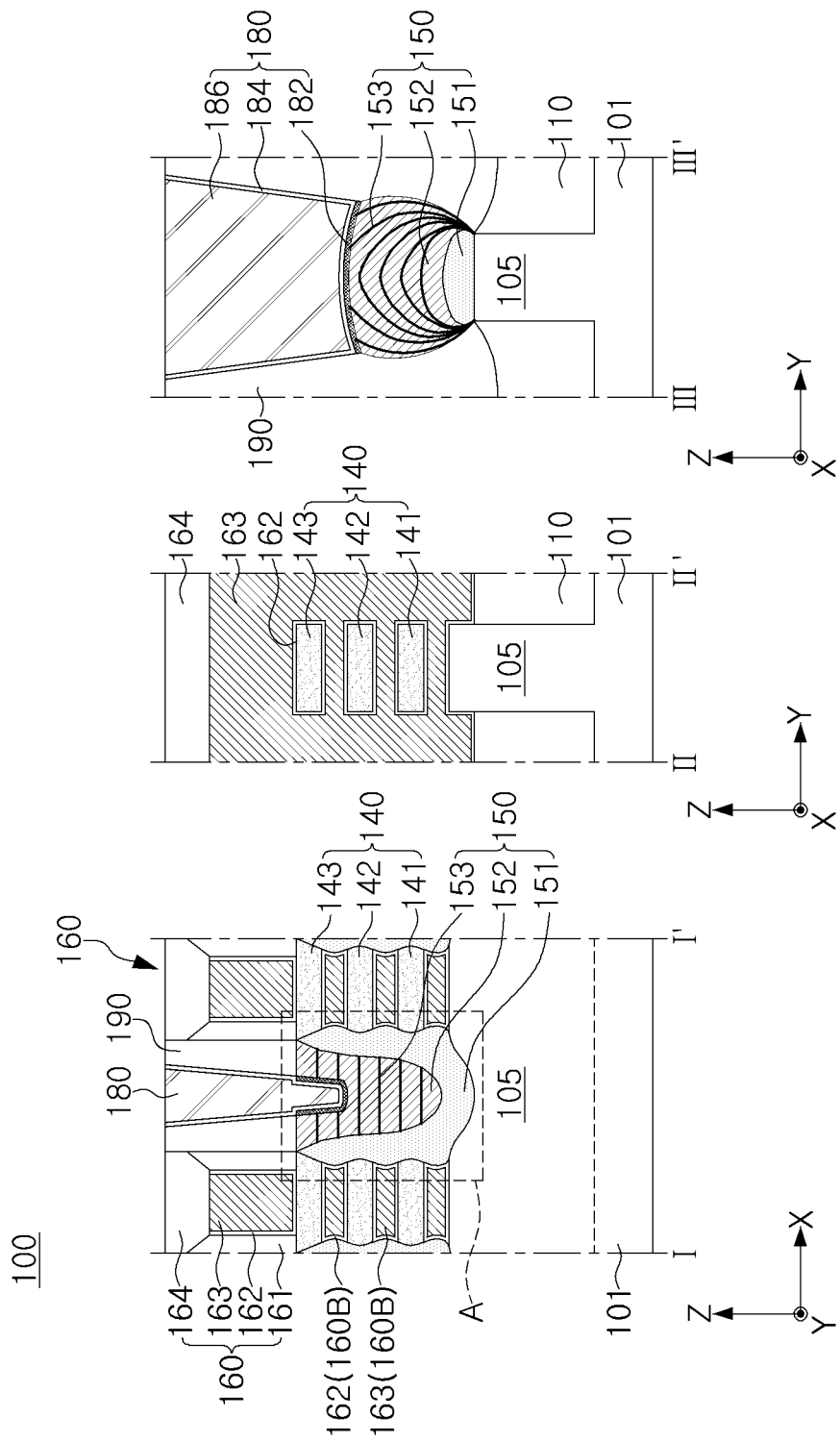
FIG. 2A is a cross-sectional view illustrating a semiconductor device according to example embodiments.

FIG. 2A is a cross-sectional view illustrating a semiconductor device according to example embodiments. FIG. 2A illustrates cross-sections of the semiconductor device, respectively taken along lines I-I', II-II', and III-III' of FIG. 1.

Figure 2B:
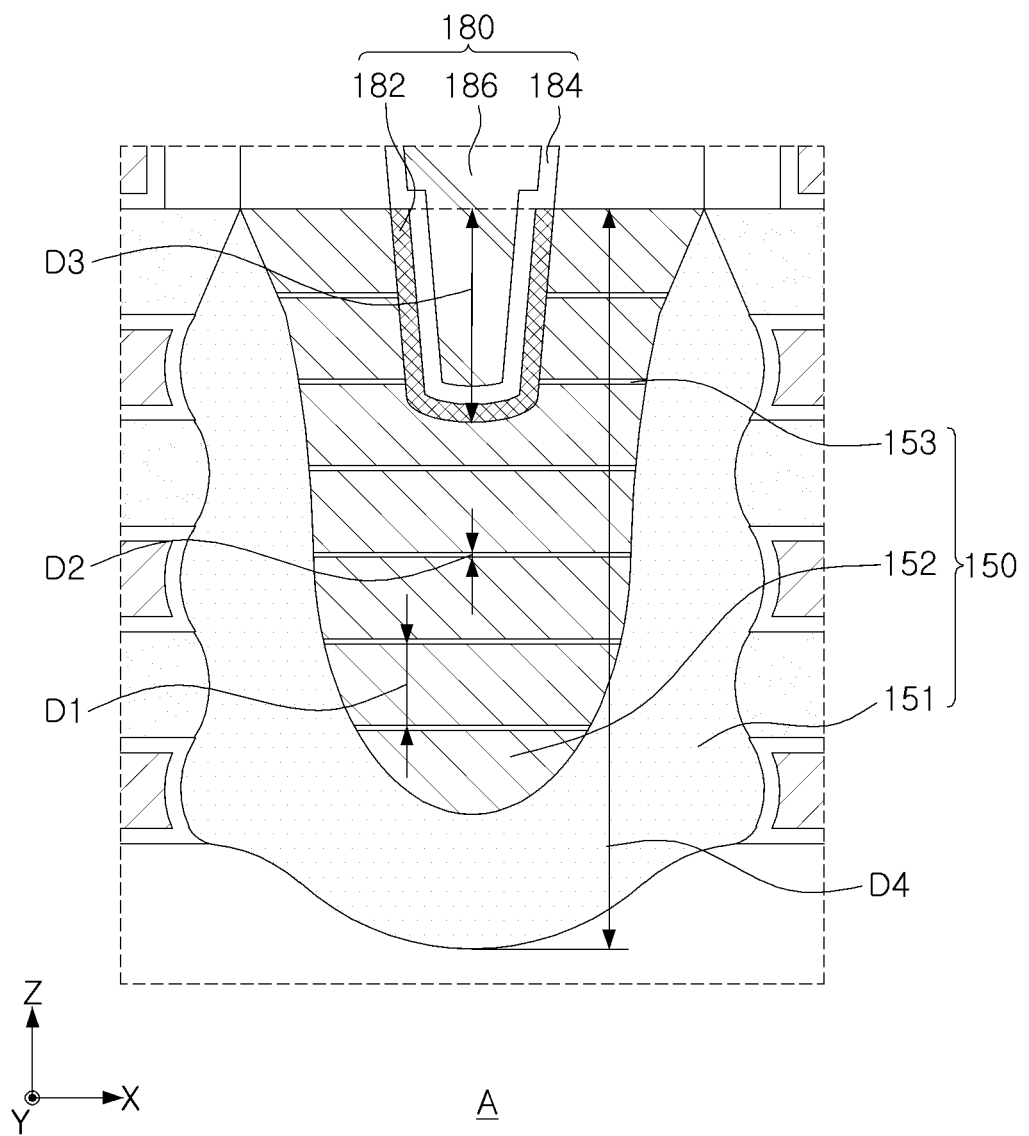
FIG. 2B is a partially enlarged view illustrating a portion of the semiconductor device of FIG. 2A according to example embodiments.

FIG. 2B is a partially enlarged view illustrating a portion of the semiconductor device 100 of FIG. 2A according to example embodiments. FIG. 2B is an enlarged view of region "A" of FIG. 2A.

For ease of description, only main elements of the semiconductor device are illustrated in FIGS. 1, 2A and 2B.

Referring to FIGS. 1, 2A and 2B, a semiconductor device 100 may include a substrate 101, an active region 105 on the substrate 101, a channel structure 140 including a plurality of channel layers 141, 142, and 143 vertically spaced apart from each other on the active region 105, a source/drain region 150 contacting the plurality of channel layers 141, 142, and 143, a gate structure 160 extending to intersect the active region 105, and a contact plug 180 connected to source/drain region 150. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. The semiconductor device 100 may further include isolation layers 110 and an interlayer insulating layer 190. The gate structure 160 may include a spacer layer 161, a gate dielectric layer 162, a gate electrode layer 163, and a gate capping layer 164.

In the semiconductor device 100, the active region 105 may have a fin structure, and the gate electrode layer 163 may be disposed between the active region 105 and the channel structure 140, between the plurality of channel layers 141, 142, and 143 of the channel structures 140, and on an upper portion of the channel structure 140. Accordingly, the semiconductor device 100 may include a gate-all-around type field effect transistor formed by the channel structure 140, the source/drain regions 150, and the gate structure 160, for example, a multi-bridge channel field effect transistor (MBCFET™). The transistor may be, for example, NMOS transistors or PMOS transistors.

The substrate 101 may have an upper surface extending in an X-direction and a Y-direction. The substrate 101 may include or be formed of a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The isolation layer 110 may define an active region 105 in the substrate 101. The isolation layer 110 may be formed with, for example, a shallow trench isolation (STI) process. In example embodiments, the isolation layer 110 may further include a region having a step with respect to a lower portion of the substrate 101 and extending deeper. The isolation layer 110 may expose a portion of an upper portion of the active region 105. In example embodiments, the isolation layer 110 may have a curved upper surface having a level increased in a direction toward the active region 105. The isolation layer 110 may be formed of an insulating material. The device isolation layer 110 may include, for example, an oxide, a nitride, and/or a combination thereof.

The active region 105 may be defined by the isolation layer 110 in the substrate 101 and may be disposed to extend in a first direction (for example, the X-direction). For example, the active region 105 may extend horizontally with respect to the upper surface of the substrate 101 in the first direction. The active region 105 may have a structure protruding from the substrate 101. An upper end of the active region 105 may be disposed to protrude from an upper surface of the isolation layer 110 to a predetermined height. The active region 105 may be formed as a portion of the substitute 101 or may include an epitaxial layer grown from the substrate 101. However, a portion of the active region 105 on the substrate 101 may be recessed on opposite sides of the gate structures 160, and the source/drain regions 150 may be disposed on the recessed active region 105. The active region 105 may include impurities or doped regions including impurities.

The channel structure 140 may include two or more channel layers, first to third channel layers 141, 142, and 143, disposed on the active region 105 to be spaced apart from each other in a direction, perpendicular to an upper surface of the active region 105, for example, in a Z-direction. The first to third channel layers 141, 142, and 143 may be connected to the source/drain region 150 and may be spaced apart from an upper surface of the active region 105. The first to third channel layers 141, 142, and 143 may have a width, the same as or similar to a width of the active region 105 in the Y-direction), and may have a width, the same as or similar to a width of the gate structure 160 in the X-direction. However, in example embodiments, the first to third channel layers 141, 142, and 143 may have a reduced width such that side surfaces thereof are disposed below the gate structure 160 in the X-direction.

The first to third channel layers 141, 142, and 143 may be formed of a semiconductor material and may include at least one of, for example, silicon (Si), silicon-germanium (SiGe), and germanium (Ge). The first to third channel layers 141, 142, and 143 may be formed of, for example, the same material as the substrate 101. The number and shape of the channel layers 141, 142, and 143, constituting a single channel structure 140, may vary depending on example embodiments. For example, in example embodiments, the channel structure 140 may further include a channel layer disposed on the upper surface of the active region 105.

The source/drain regions 150 may be disposed on the active region 105 on opposite sides of the channel structure 140. The source/drain region 150 may include a first epitaxial layer 151, disposed along a side surface of each of the first to third channel layers 141, 142, and 143 of the channel structure 140, and second epitaxial layers 152 and doping layers 153 disposed on the first epitaxial layer 151. Both the first epitaxial layer 151 and the second epitaxial layers 152 may be semiconductor layers including silicon (Si), and may include different types and/or concentrations of impurities.

The first epitaxial layer 151 may be disposed on the active region 105 and may extend to contact the plurality of channel layers 141, 142, and 143. The first epitaxial layer 151 may contact a lower portion 160B of the gate structure 160 disposed below each of the channel layers 141, 142, and 143.

The first epitaxial layer 151 may include a protrusion protruding toward the gate structure 160 on the same level as the lower portion 160B of the gate structure 160. According to example embodiments, a side surface of the lower portion 160B of the gate structure 160 in the first direction (the X-direction) may be recessed to a predetermined depth to have an inwardly concave shape. The protrusion of the first epitaxial layer 151 may be disposed in a recessed region of the lower portion 160B of the gate structure 160.

A surface of the first epitaxial layer 151 contacting the plurality of channel layers 141, 142, 143 and the lower portion 160B of the gate structure 160 may have a wavy shape, but example embodiments are not limited thereto. The shape of the first epitaxial layer 151 may vary depending on a shape of the channel structure 140, a shape of the gate structure 160, or the like. For example, when the semiconductor device further includes an internal spacer on an outer side of the lower portion 160B, an external surface of the first epitaxial layer 151 may have a shallow curved shape. The first epitaxial layer 151 may have a substantially U-shape in the cross-section taken along line I-I' in the X-direction, but example embodiments are not limited thereto.

The first epitaxial layer 151 may include silicon-germanium (SiGe) doped with a group III element and may have, for example, P-type conductivity. The first epitaxial layer 151 may include at least one of, for example, arsenic (As), phosphorus (P), antimony (Sb), boron (B), gallium (Ga), carbon (C), germanium (Ge), and aluminum (Al) and may be a SiP layer, a SiCP layer, a SiSb layer, a SiAs layer, a SiCSb layer, a SiCAs layer, a SiC layer, a SiGe layer, a SiGe:B layer, a SiGe:C layer, a SiGe:C:B layer, a SiGe:Ga layer, a SiGe:Ga:B layer, or a SiGa layer. A concentration of germanium (Ge) in the first epitaxial layer 151 may be lower than a concentration of germanium (Ge) in a sacrificial layer (120 of FIGS. 11A to 11G) before the gate structure 160 is substituted. The first epitaxial layer 151 may have lower etching selectivity than the sacrificial layer 120 under specific etching conditions during a fabrication process. Due to such a difference in etching selectivity, the sacrificial layer 120 may be selectively removed in a process of FIG. 11H to be described later, and the source/drain region 150 surrounded by the first epitaxial layer 151 may remain. An impurity concentration of the first epitaxial layer 151 may be lower than an impurity concentration of the second epitaxial layers 152.

The second epitaxial layers 152 may be disposed on the first epitaxial layer 151 and may be epitaxially grown on the first epitaxial layer 151. The second epitaxial layers 152 may include silicon-germanium (SiGe) doped with a group III element and may have, for example, P-type conductivity. The second epitaxial layers 152 may include at least one of, for example, arsenic (As), phosphorus (P), antimony (Sb), boron (B), gallium (Ga), carbon (C), germanium (Ge), and aluminum (Al) and may be a SiP layer, a SiCP layer, a SiSb layer, a SiAs layer, a SiCSb layer, a SiCAs layer, a SiC layer, a SiGe layer, a SiGe:B layer, a SiGe:C layer, a SiGe:C:B layer, a SiGe:Ga layer, a SiGe:Ga:B layer, or a SiGa layer. The second epitaxial layers 152 may be regions including impurities in a higher concentration than an impurity concentration of the first epitaxial layer 151. Doped impurities of the second epitaxial layers 152 may be the same as or different from doped impurities of the first epitaxial layer 151. The second epitaxial layers 152 may include impurities implanted when the second epitaxial layers 152 are formed, and may further include impurities diffused from the doping layers 153. An impurity concentration of the second epitaxial layers 152 may have a range of about $1 \times 10^{17}$ atoms/cm$^3$ to about $5 \times 10^{21}$ atoms/cm$^3$. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range. At least a portion of the second epitaxial layers 152 may be substantially coplanar with an upper surface of the uppermost channel layer 143. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The second epitaxial layers 152 may not grow on a side surface of the first epitaxial layer 151, but may only grow in a lower portion of the first epitaxy layer 151 in a bottom-up manner. Thus, side surfaces of each of the second epitaxial layers 152 and the doping layers 153 may contact the first epitaxial layer 151. Accordingly, in the cross-section I-I' taken in the X-direction of FIG. 2A, each of the second epitaxial layers 152 and each of the doping layers 153 may extend horizontally with respect to an upper surface of the substrate 101 in the first direction (the X-direction).

The first epitaxial layer 151 and the second epitaxial layers 152 may include silicon-germanium (SiGe) or silicon (Si) doped with a group III element. In example embodiments, the first to second epitaxial layers 151 and 152 may have P-type conductivity. For example, each of the first epitaxial layer and the second epitaxial layers 151 and 152 may include silicon-germanium (SiGe), and may include at least one of boron (B), arsenic (As), phosphorus (P), antimony (Sb), aluminum (Al), gallium (Ga), indium (In), and thallium (Tl), as a doping element.

The first epitaxial layer and the second epitaxial layers 151 and 152 may have different concentrations of germanium (Ge).

According to an example embodiment, the concentrations of germanium (Ge) of the second epitaxial layers 152 may be the same as each other, but example embodiments are not limited thereto. Some of the second epitaxial layers 152 may have different concentrations of germanium (Ge). The concentrations of germanium (Ge) may gradually increase in a direction from a lower portion of the second epitaxial layers 152 to an upper portion of the second epitaxial layers 152, for example, in the Z-direction. For example, the concentration of germanium (Ge) may increase in the order of the first epitaxial layer 151, the lower portion of the second epitaxial layers 152, and the upper portion of the second epitaxial layers 152, but example embodiments are not limited thereto.

The doping layers 153 may be stacked alternately with the second epitaxial layers 152 on the first epitaxial layer 151 to form a superlattice structure. The doping layers 153 may be formed to dope the second epitaxial layers 152 and/or to reduce resistance of the source/drain region 150. The doping layers 153 may substantially be epitaxial layers formed by epitaxially growing a semiconductor layer including impurities on the second epitaxial layers 152, and each of the doping layers 153 may be formed to have a uniform thickness.

The doping layers 153 may include impurities for doping the second epitaxial layers 152, and the impurities may include any one of phosphorus (P), arsenic (As), boron (B), gallium (Ga), and antimony (Sb), aluminum (Al), thallium (Tl), and indium (In). An impurity concentration of the doping layers 153 may have a range of about $1\times10^{19}$ atoms/cm$^3$ to about $1\times10^{22}$ atoms/cm$^3$, and may be higher than an impurity concentration of the second epitaxial layers 152. In addition, the impurity concentration of the doping layers 153 may be higher than an impurity concentration of the second epitaxial layers 152 and an impurity concentration of the second epitaxial layers 152 including impurities diffused from the doping layers 153 after the doping layers 153 are formed. A resistivity of the second epitaxial layers 152 may be higher than a resistivity of the doping layers 153. Accordingly, the doping layers 153 may be brought into contact with the contact plug 180 to reduce contact resistance, and performance of the semiconductor device 100 may be improved.

Referring to FIG. 2B, the number of doping layers 153 present between the second epitaxial layers 152 may be 2 to 20, and a thickness D2 of the doping layers 153 may have a range of about 0.1 nm to about 5 nm. In this case, a thickness D1 of the second epitaxial layers 152 may have a range of about 1 nm to about 10 nm, and may be greater than the thickness D2 of the doping layers 153. The second epitaxial layers 152 may be maintained at regular intervals, but example embodiments are not limited thereto.

According to an example embodiment, a distance D3 from an uppermost portion of the plurality of channel layers 141, 142, and 143 to a lowermost portion of a metal-semiconductor compound layer 182 of the contact plug 180 may be about 60 nm or less. A distance D4 from the uppermost portion of the plurality of channel layers 141, 142, and 143 to the lowermost portion of the first epitaxial layer 151 may be about 100 nm or less.

Each of the source/drain regions 150 may have a circular, elliptical, pentagonal, hexagonal, or similar shape in a cross-section in the Y-direction. However, in example embodiments, the source/drain regions 150 may have various shapes, for example, one of a polygonal shape, a circular shape, and a rectangular shape. In addition, as illustrated in FIG. 2A, the source/drain regions 150 have a substantially planar upper surface in a cross-section in the X-direction, and have a wavy shape, for example, a shape of a stripe, a portion of a circle, a portion of ellipse, or a similar shape toward a lower portion of the upper surface. In example embodiments, such a shape may vary depending on a distance between adjacent gate structures 160, a height of the active region 105, or the like.

To improve the degree of integration of the semiconductor device 100, a contacted polysilicon pitch (CPP) between adjacent gate structures is decreased. However, due to a decrease in CPP, a contact area may be reduced such that a contact resistance is increased.

Since the source/drain region 150 according to an example embodiment has the above-described structural characteristics, the metal-semiconductor compound layer 182 of the contact plug 180 may always contact the doping layers 153, irrespective of a depth of the contact hole when the contact plug 180 is formed, to reduce contact resistance. According to the source/drain regions 150 in example embodiments, impurities may be prevented from diffusing in a direction of a channel or a substrate as compared with the case in which impurities are heavily doped into the entire source/drain region 150, and damage to a crystal structure may be prevented as compared with the case in which high-current ion implantation is performed before the contact plug 180 is formed. Thus, the performance of the semiconductor device 100 may be improved.

The gate structure 160 may be disposed to intersect the active region 105 and the channel structures 140 and to extend in one direction, for example, the Y-direction, on the active region 105 and the channel structures 140. Channel regions of transistors may be formed in the active region 105 and the channel structures 140 intersecting the gate structure 160. The gate structure 160 may include a gate electrode layer 163, a gate dielectric layer 162 between the gate electrode layer 163 and the plurality of channel layers 141, 142, and 143, spacer layers 161 on side surfaces of the gate electrode layer 163, and a gate capping layer 164 on an upper surface of the gate electrode layer 163.

The gate dielectric layer 162 may be disposed between the active region 105 and the gate electrode layer 163 and between the channel structure 140 and the gate electrode layer 163, and may be disposed to cover at least a portion of surfaces of the gate electrode layer 163. For example, the gate dielectric layer 162 may be disposed to surround all surfaces of the gate electrode 163, except for an uppermost surface of the gate electrode layer 163. The gate dielectric layer 162 may extend between the gate electrode layer 163 and the spacer layers 161, but example embodiments are not limited thereto. The gate dielectric layer 162 may include an oxide, a nitride, or a high-k dielectric material. The high-k dielectric material may refer to a dielectric material having a dielectric constant, higher than that of a silicon oxide layer ($SiO_2$). The high-k dielectric material may be one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode layer 163 may be disposed on the active region 105 to extend upwardly of the channel structure 140 while filling spaces between the channel layers 141, 142, and 143. The gate electrode layer 163 may be spaced apart from the plurality of channel layers 141, 142, and 143 by the gate dielectric layer 162. The gate electrode layer 163 may include a conductive material. The gate electrode layer 163 may include, for example, a metal nitride such as titanium nitride (TiN), tantalum nitride (TaN), or tungsten nitride (WN) and/or a metal material such as aluminum (Al), tungsten (W), or molybdenum (Mo), or a semiconductor material such as doped polysilicon.

The gate electrode layer 163 may have a multilayer structure including two or more layers. The spacer layers 161 may be disposed on opposite sides of the gate electrode layer 163. The gate spacer layers 161 may insulate the source/drain region 150 from the gate electrode layer 163. In example embodiments, the spacer layers 161 may have a multilayer structure. The spacer layers 161 may include at least one of an oxide, a nitride, an oxynitride, and a low-k dielectric material.

The gate capping layer 164 may be disposed on the gate electrode layer 163, and a lower surface of the gate capping layer 164 may be surrounded by the gate electrode layer 163 and the spacer layers 161.

The interlayer insulating layer 190 may be disposed to cover the source/drain region 150, the gate structure 160, and the isolation layer 110. The interlayer insulating layer 190 may include at least one of, for example, an oxide, a nitride, an oxynitride, and a low-k dielectric material.

The contact plug 180 may penetrate through the interlayer insulating layer 190 to be connected to the source/drain region 150, and may apply an electrical signal to the source/drain region 150. The contact plug 180 may be disposed on the source/drain region 150. In example embodiments, the contact plug 180 may be disposed to have a length, larger than a length of the source/drain region 150, in the Y-direction. The contact plug 180 may have an inclined side of which a width of a lower portion is narrower than a width of an upper portion depending on an aspect ratio, but example embodiments are not limited thereto. The contact plug 180 may be disposed to recess the source/drain region 150 by a predetermined depth. The contact plugs 180 may include the metal-semiconductor compound layer 182 disposed on a lower end, a barrier layer 184 disposed along sidewalls, and a plug conductive layer 186. The metal-semiconductor compound layer 182 may be, for example, a metal silicide layer. The barrier layer 184 may include, for example, a metal nitride such as a titanium nitride layer (TiN), a tantalum nitride layer (TaN), or a tungsten nitride layer (WN). The plug conductive layer 186 may include, for example, a metal material such as aluminum (Al), tungsten (W), or molybdenum (Mo).

According to an example embodiment, the contact plug 180 may be formed to penetrate through the second epitaxial layers 152 and to contact at least a portion of the doping layers 153. In this case, the metal-semiconductor compound layer 182 of the contact plug 180 may contact a portion of the doping layers 153, and a lower end of the metal-semiconductor compound layer 182 may be disposed at a level lower than a level of an upper end of the plurality of channel layers 141, 142, and 143.

Figure 3:
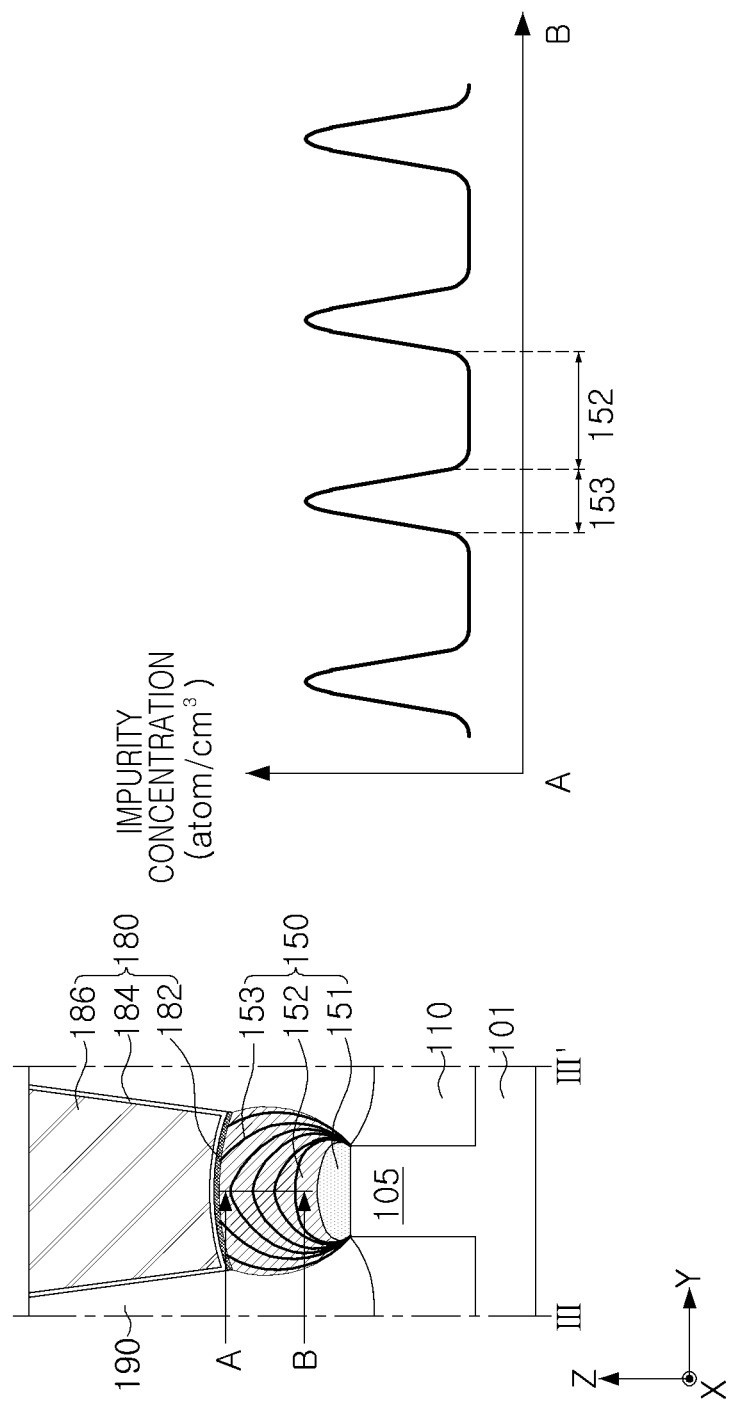
FIG. 3 is a view illustrating a distribution of impurity concentration in a source/drain region in a semiconductor device according to example embodiments.

FIG. 3 illustrates a distribution of an impurity concentration in a source/drain region in the semiconductor device 100 according to example embodiments.

FIG. 3 illustrates an impurity concentration profile of the source/drain region 150 along line A-B in portion III-III' of FIG. 2A. In FIG. 3, a horizontal axis of the graph represents a depth from point A to point B, and a vertical axis represents an impurity concentration. The graph of FIG. 3 illustrates an impurity concentration of the second epitaxial layer 152 and an impurity concentration distribution of the doping layers 153. In this case, an impurity concentration in a region corresponding to each of the doping layers 153 may have a peak value and may be distributed to be similar to a normal distribution. In a region corresponding to each of the second epitaxial layers 152, an impurity concentration in a region adjacent to the doping layers 153 may be relatively high, and a region spaced apart from the doping layers 153 may include a region having a constant impurity concentration, but example embodiments are not limited thereto.

FIG. 4A and FIGS. 5 to 7 and 8A are cross-sectional views illustrating semiconductor devices 100a to 100e according to example embodiments.

Figure 4A:
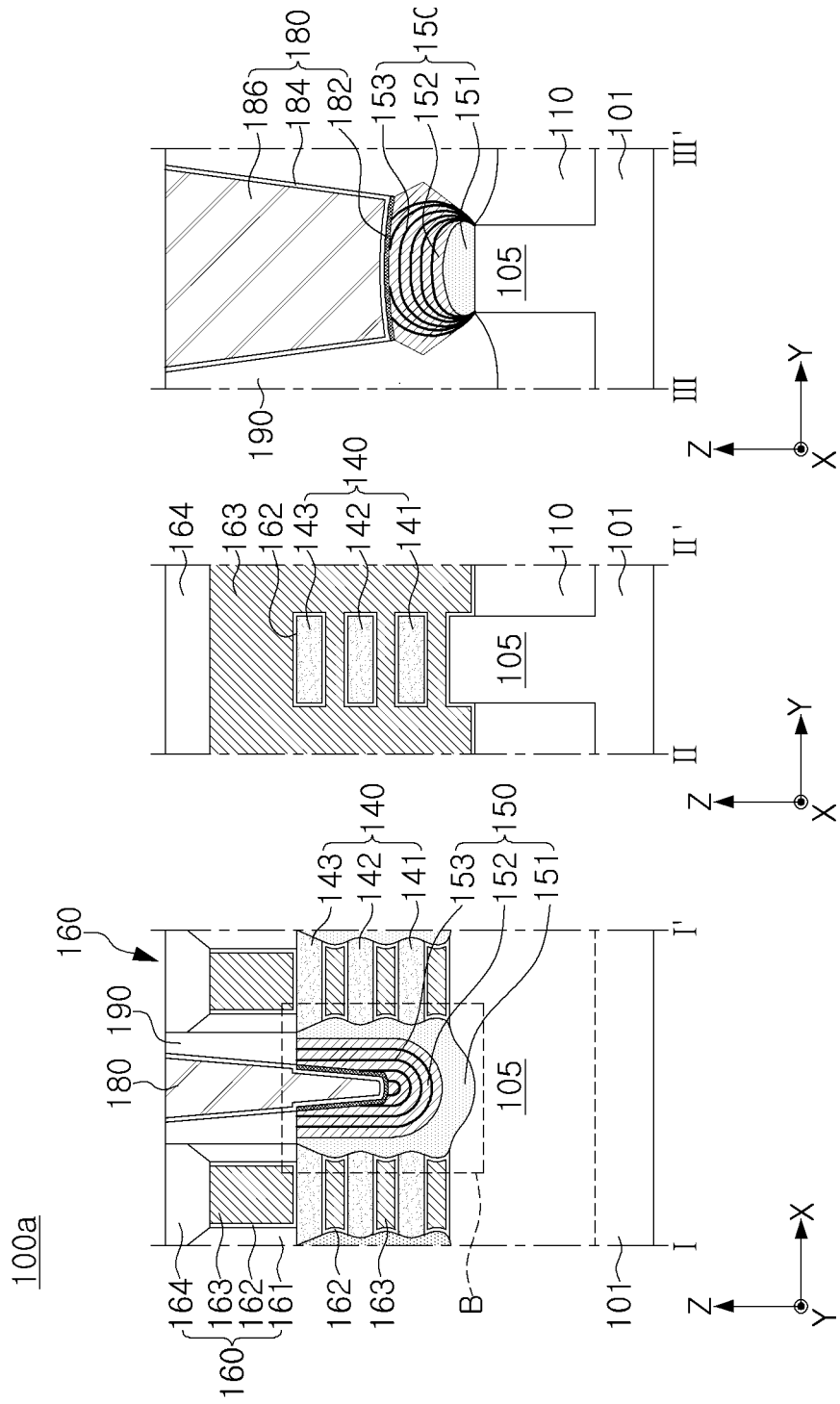
FIG. 4A is a cross-sectional view illustrating a semiconductor device according to example embodiments.
Figure 4B:
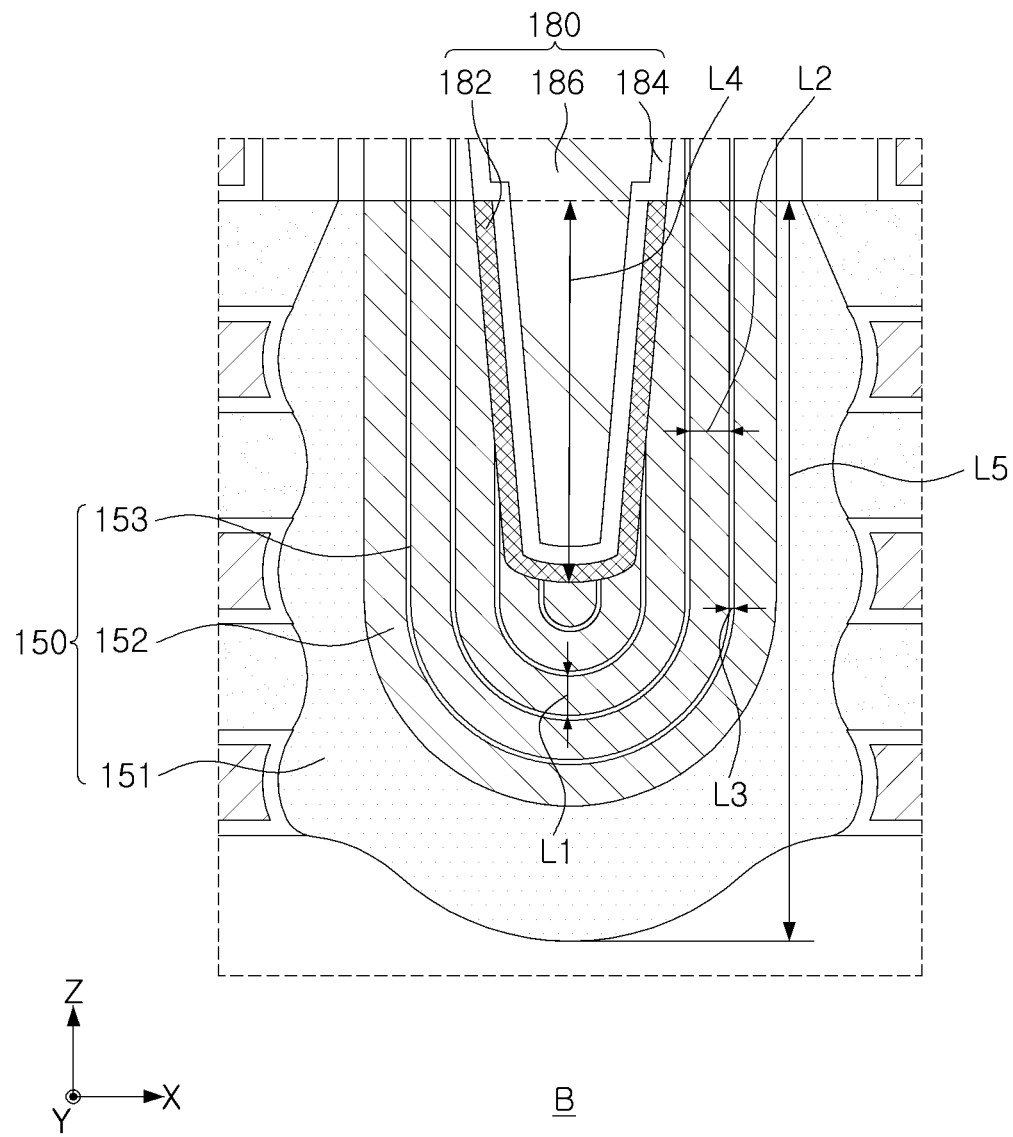
FIG. 4B is a partially enlarged view illustrating a portion of the semiconductor device of FIG. 4A according to example embodiments.

FIG. 4B is a partially enlarged view illustrating a portion of the semiconductor device 100a according to example embodiments. FIG. 4B is an enlarged view of region "B" of FIG. 4A.

Figure 8A:
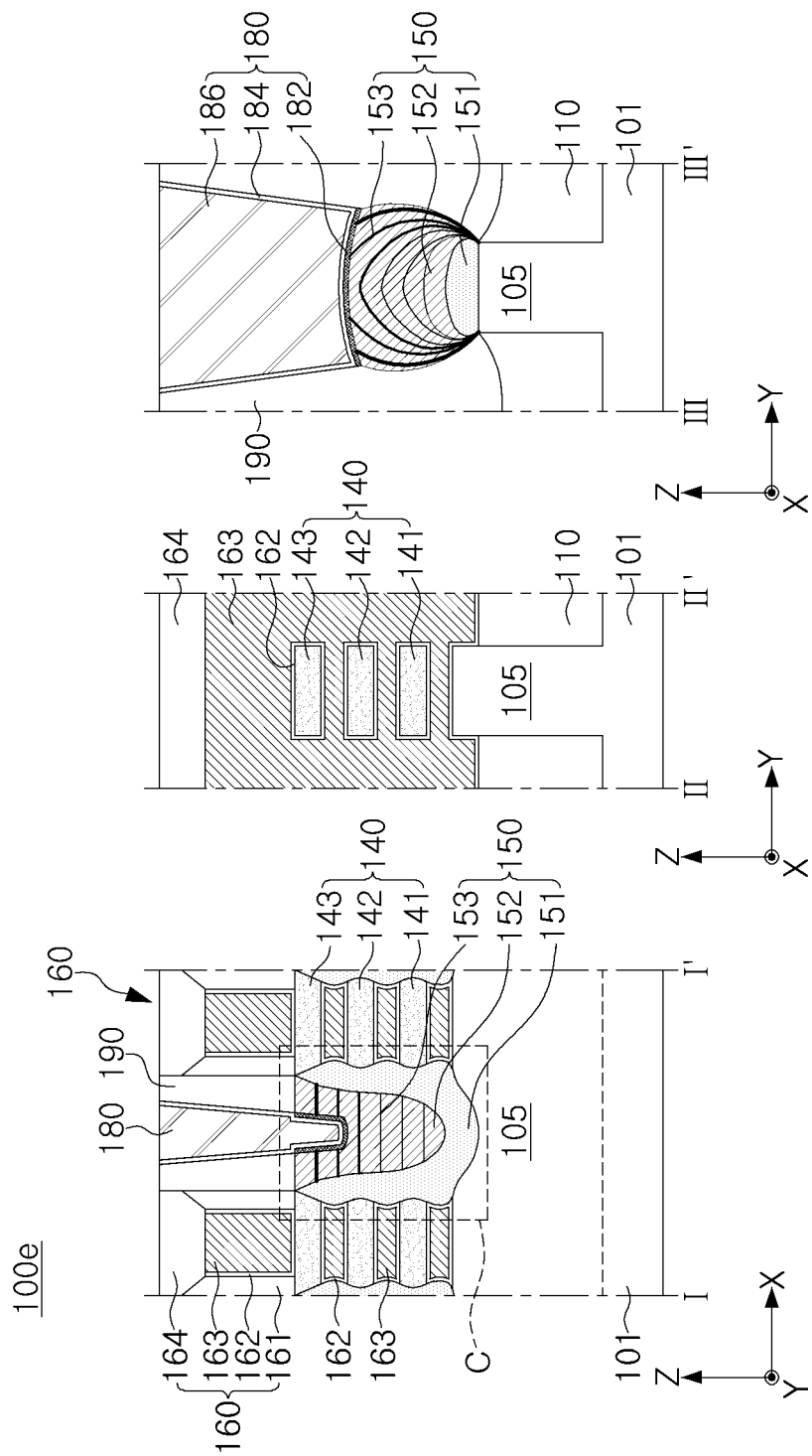
Figure 8B:
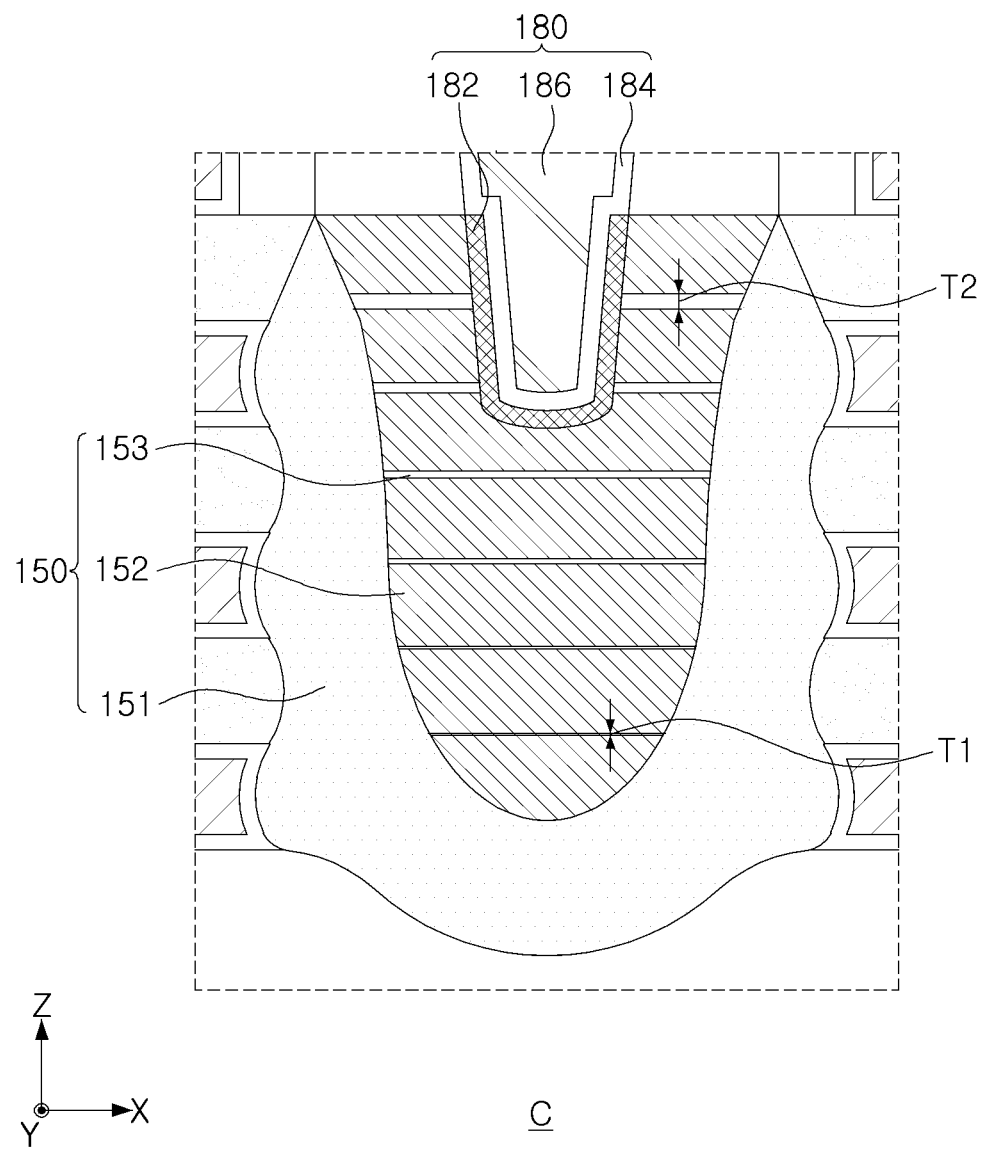
FIG. 8B is a partially enlarged view illustrating a portion of the semiconductor device of FIG. 8A according to example embodiments.

FIG. 8B is a partially enlarged view illustrating a portion of the semiconductor device 100e according to example embodiments. FIG. 8B is an enlarged view of region "C" of FIG. 8A.

In FIGS. 4A, 4B, 5 to 7, 8A and 8B, the same reference numerals as those in FIG. 2A represent corresponding elements, and redundant descriptions thereof will be omitted.

Referring to FIG. 4A, among second epitaxial layers 152 of a semiconductor device 100a, the lowermost second epitaxial layer 152 may cover an entire internal surface of a first epitaxial layer 151, unlike the example embodiment in FIG. 2A. Concentrations of doped impurities in the second epitaxial layers 152 may be substantially the same as each other, but example embodiments are not limited thereto. In the present specification, the wording "substantially the same" means that numerical values of concentration, thickness, and the like, are not only completely the same, but also the same within a range including a difference that may occur due to process error in simultaneously elements even in the same process, and may be construed as having the same meaning, even when the term "substantially" is omitted.

The second epitaxial layers 152 may have a substantially uniform thickness and may conformally cover the first epitaxial layer 151 and the doping layers 153. Accordingly, each of the second epitaxial layers 152 and the doping layers 153 may have a downwardly convex shape in a cross-section I-I' taken in an X-direction.

The metal-semiconductor compound layer 182 of the contact plug 180 may contact some doping layers 153, among the doping layers 153, and may further contact at least some second epitaxial layers 152, among the second epitaxial layers 152.

Referring to FIG. 4B, second epitaxial layers 152 and doping layers 153, formed by doping the second epitaxial layers 152, may be alternately stacked to form a superlattice structure. An aspect ratio of the second epitaxial layers 152 may have a range of about 0.5 to about 5. The number of doping layers 153 present between the second epitaxial layers 152 may be 2 to 20, and a thickness L3 of the doping layer 153 may have a range of about 0.1 nm to about 5 nm. In this case, a thickness L2 of the second epitaxial layers 152 may have a range of about 1 nm to about 10 nm and may be greater than the thickness L3 of the doping layer 153. Since the second epitaxial layers 152 are conformally formed, a thickness L1 of a lower portion of the second epitaxial layers 152 may be substantially the same as the thickness L2 of a side surface of the second epitaxial layers 152.

According to an example embodiment, a distance L4 from an uppermost portion of a plurality of channel layers 141, 142, and 143 to a lowermost portion of the metal-semiconductor compound layer 182 of the contact plug 180 may be about 60 nm or less. A distance L5 from the uppermost portion of the plurality of channel layers 141, 142, and 143 to the lowermost portion of the first epitaxial layer 151 may be about 100 nm or less.

Figure 5:
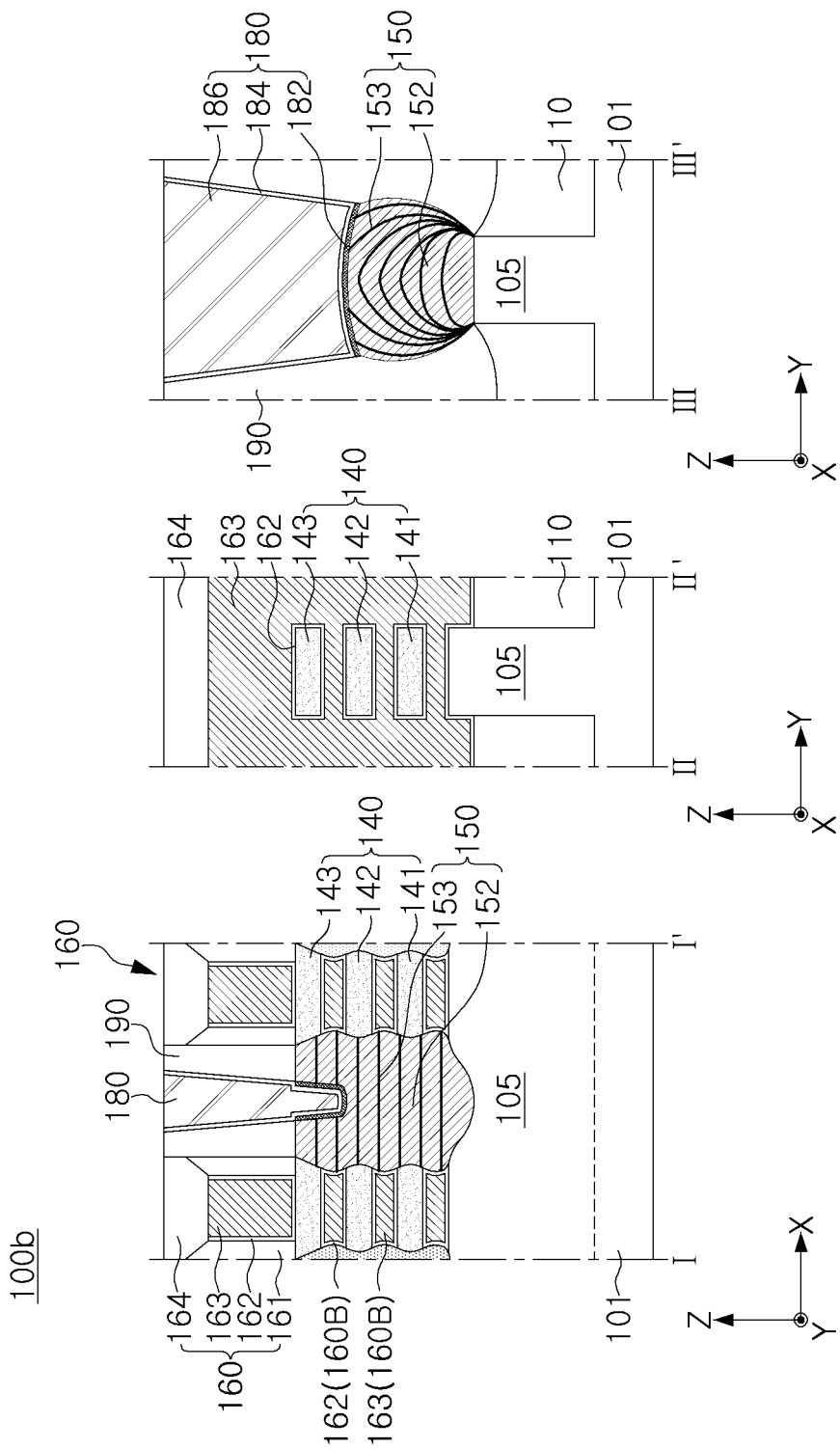
FIGS. 5 to 7 and 8A are cross-sectional views illustrating a semiconductor device according to example embodiments.
Figure 6:
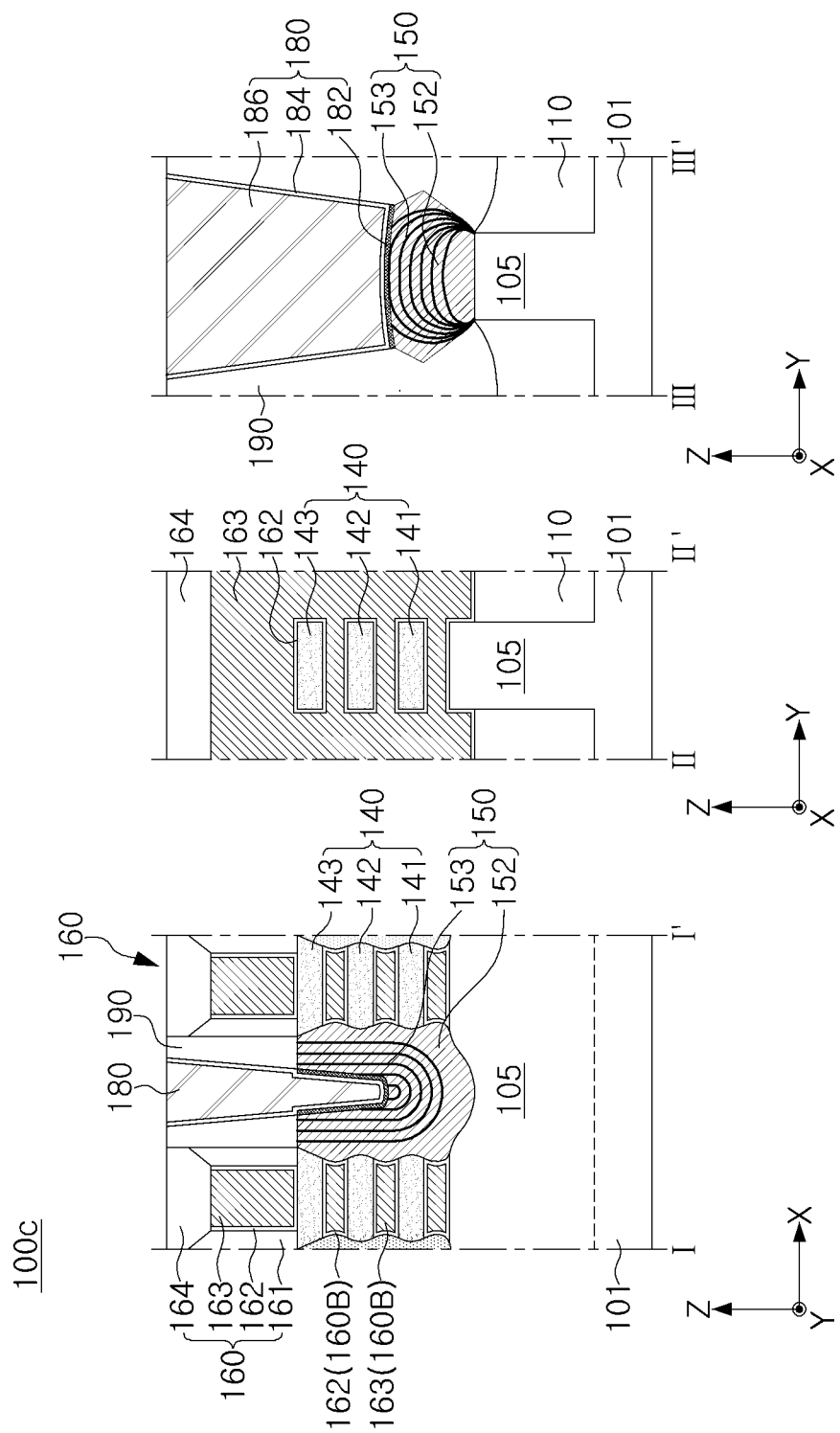

Referring to FIGS. 5 and 6, the semiconductor devices 100b and 100c may not include the first epitaxial layer 151. In the present embodiment, unlike FIGS. 2A and 4A, a first epitaxial layer 151 may be omitted and second epitaxial layers 152 may be formed in a region recessed when a source/drain region 150 is formed. Accordingly, a structure, in which the first epitaxial layer 151 is omitted, may be formed in the example embodiments of FIGS. 2A and 4A.

In the cross-section I-I' in the X-direction of FIGS. 5 and 6, each of the second epitaxial layers 152 may extend substantially horizontally with respect to an upper surface of the substrate 101. Accordingly, side portions of the second epitaxial layers 152 may contact a lower portion 160B of the gate structure 160 and the plurality of channel layers 141, 142, and 143.

A surface of the second epitaxial layers 152, contacting the plurality of channel layers 141, 142, and 143 and the lower portion 160B of the gate structure 160, may have a wavy shape, but example embodiments are not limited thereto. The shape of the second epitaxial layers 152 may vary depending on a shape of the channel structure 140, a shape of the gate structure 160, or the like. The second epitaxial layers 152 may have a superlattice structure with the doping layers 153 in a cross-section I-I' in an X-direction, but example embodiments are not limited thereto.

Figure 7:
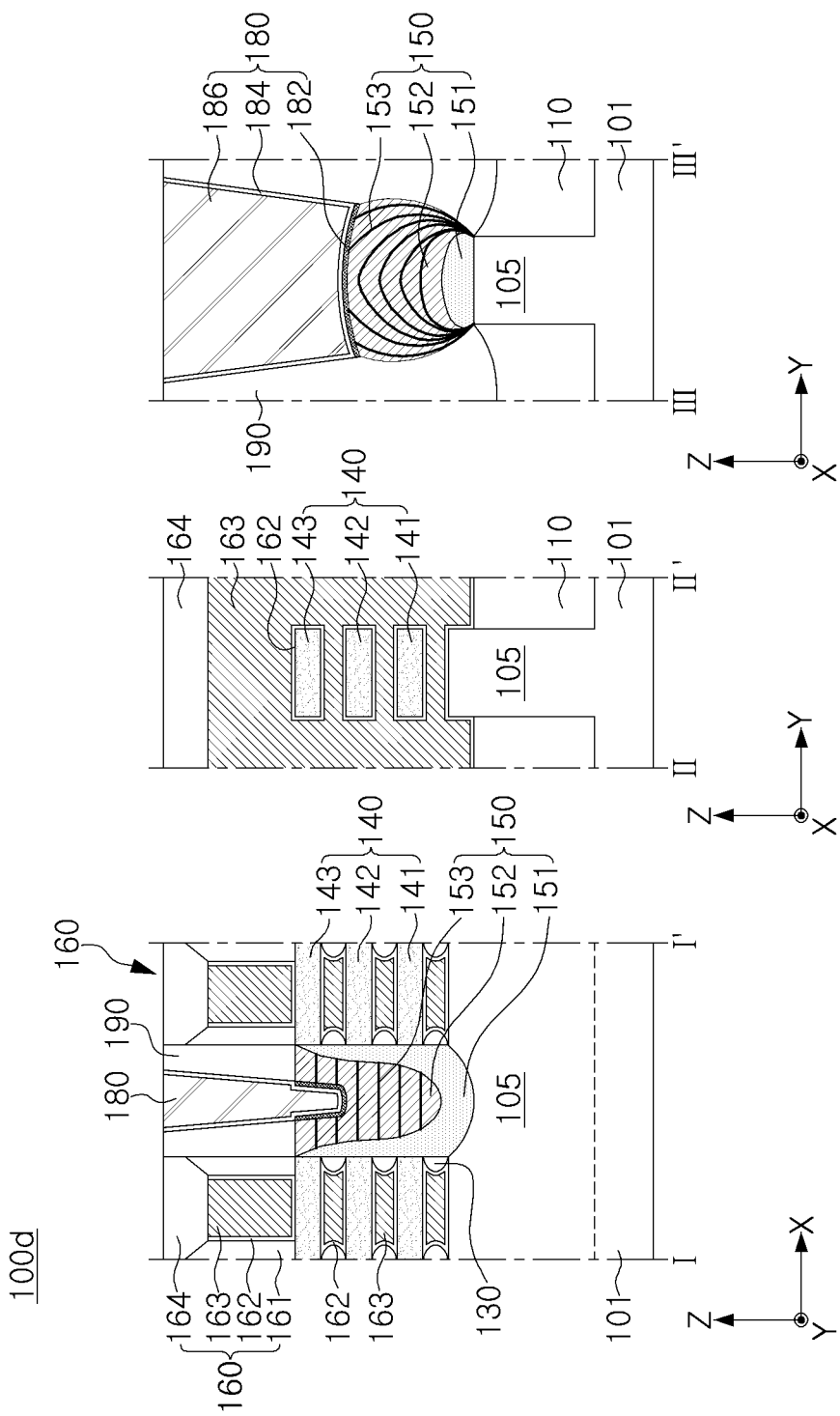

Referring to FIG. 7, a semiconductor device 100d may further include internal spacer layers 130. The internal spacer layers 130 may be disposed to be parallel to a gate electrode layer 163 between channel structures 140. Below the third channel layer 143, the gate electrode 165 may be spaced apart from the source/drain regions 150 by the internal spacer layers 130 to be electrically separated therefrom. The internal spacer layers 130 may have a shape in which a side surface thereof facing the gate electrode 163 is rounded to be convex inwardly of the gate electrode 163, but example embodiments are not limited thereto. The internal spacer layers 130 may be formed of an oxide, a nitride, or an oxynitride, for example, a low-k dielectric material.

Figure 11A:
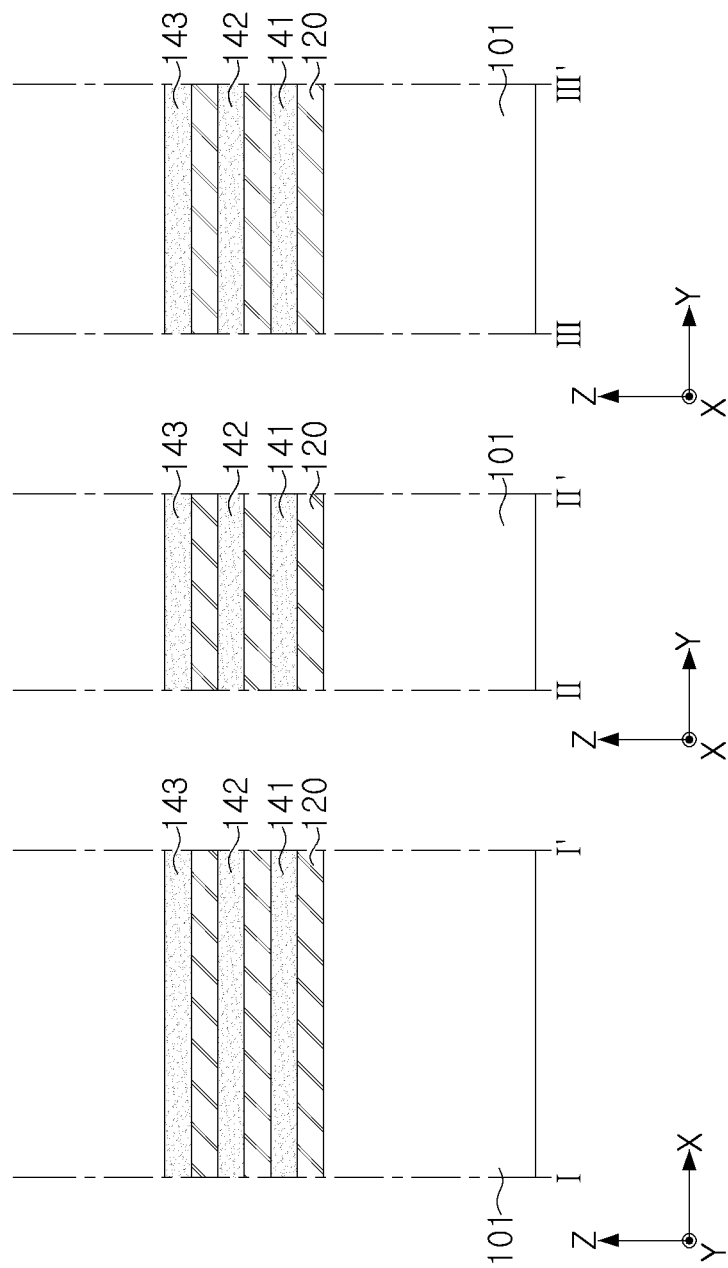
FIGS. 11A to 11K are cross-sectional views for sequentially describing a method of fabricating a semiconductor device according to example embodiments.
Figure 11B:
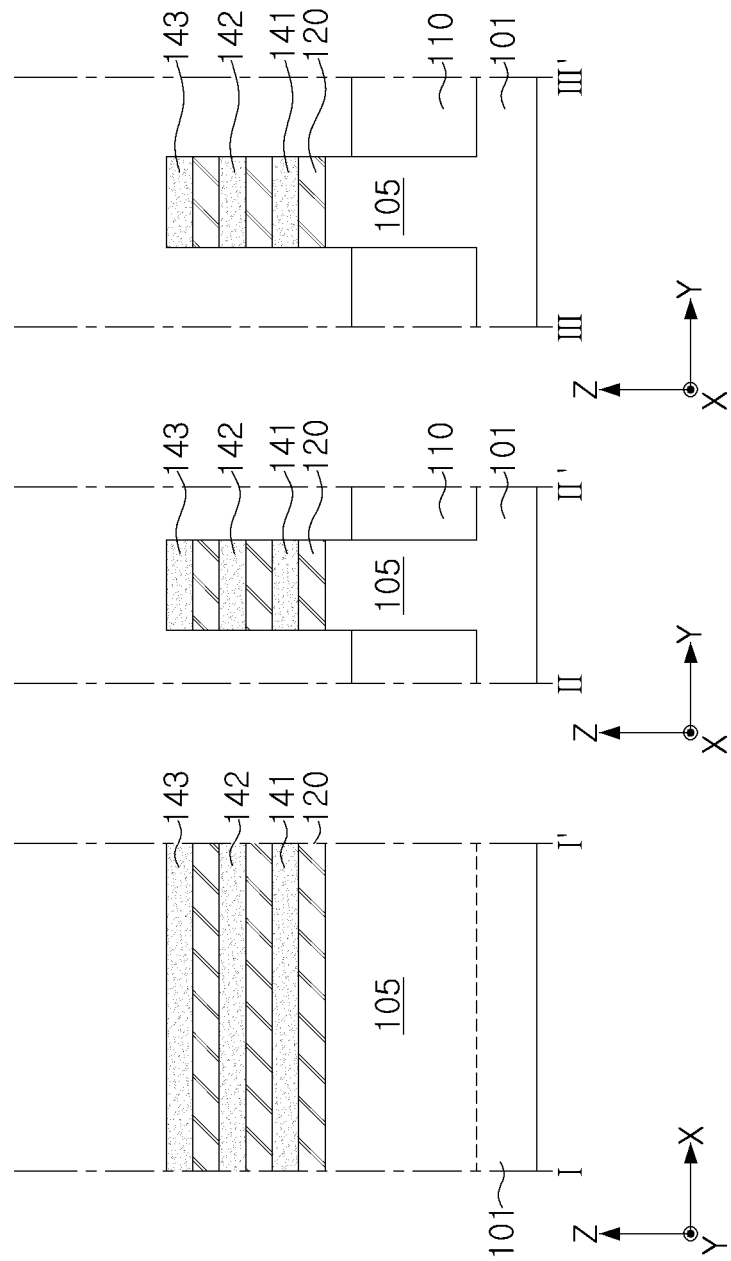
Figure 11C:
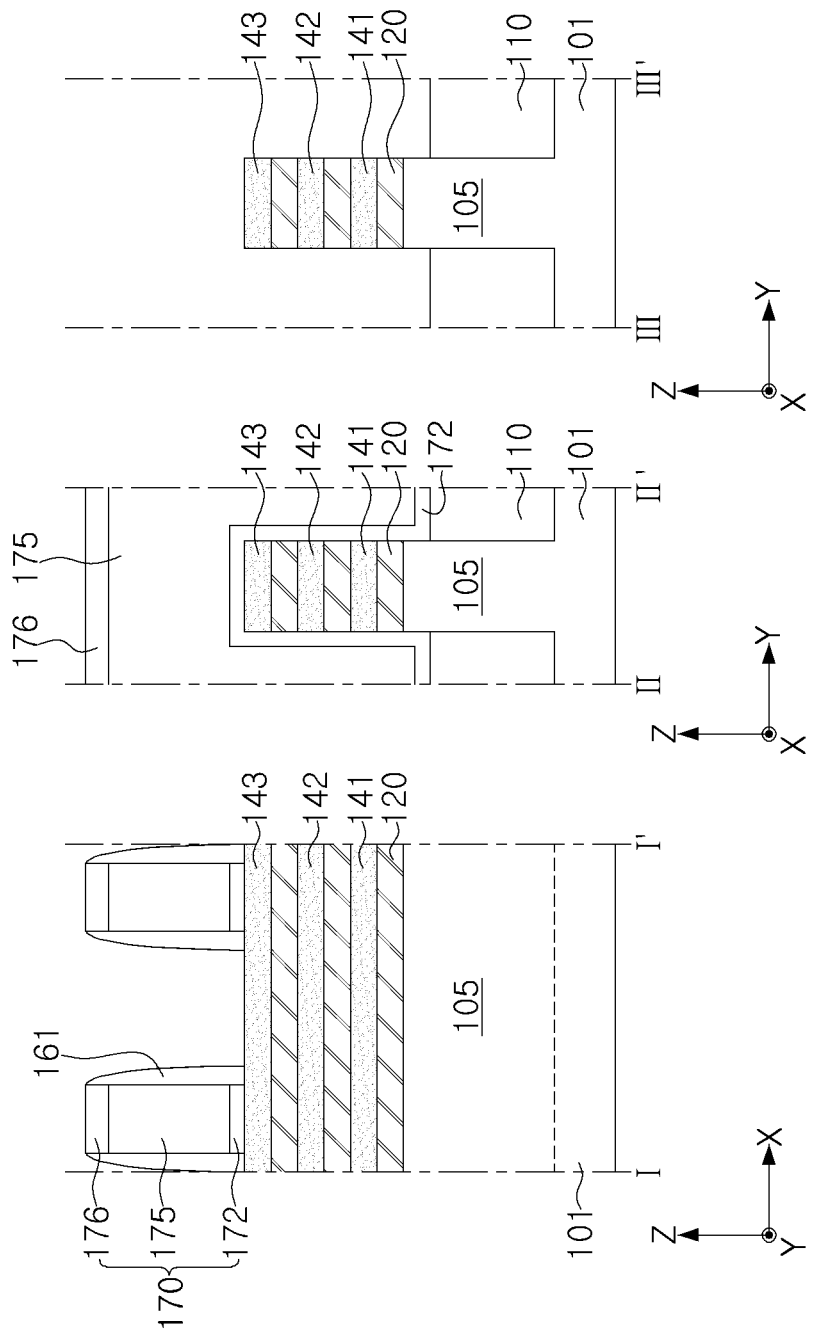
Figure 11D:
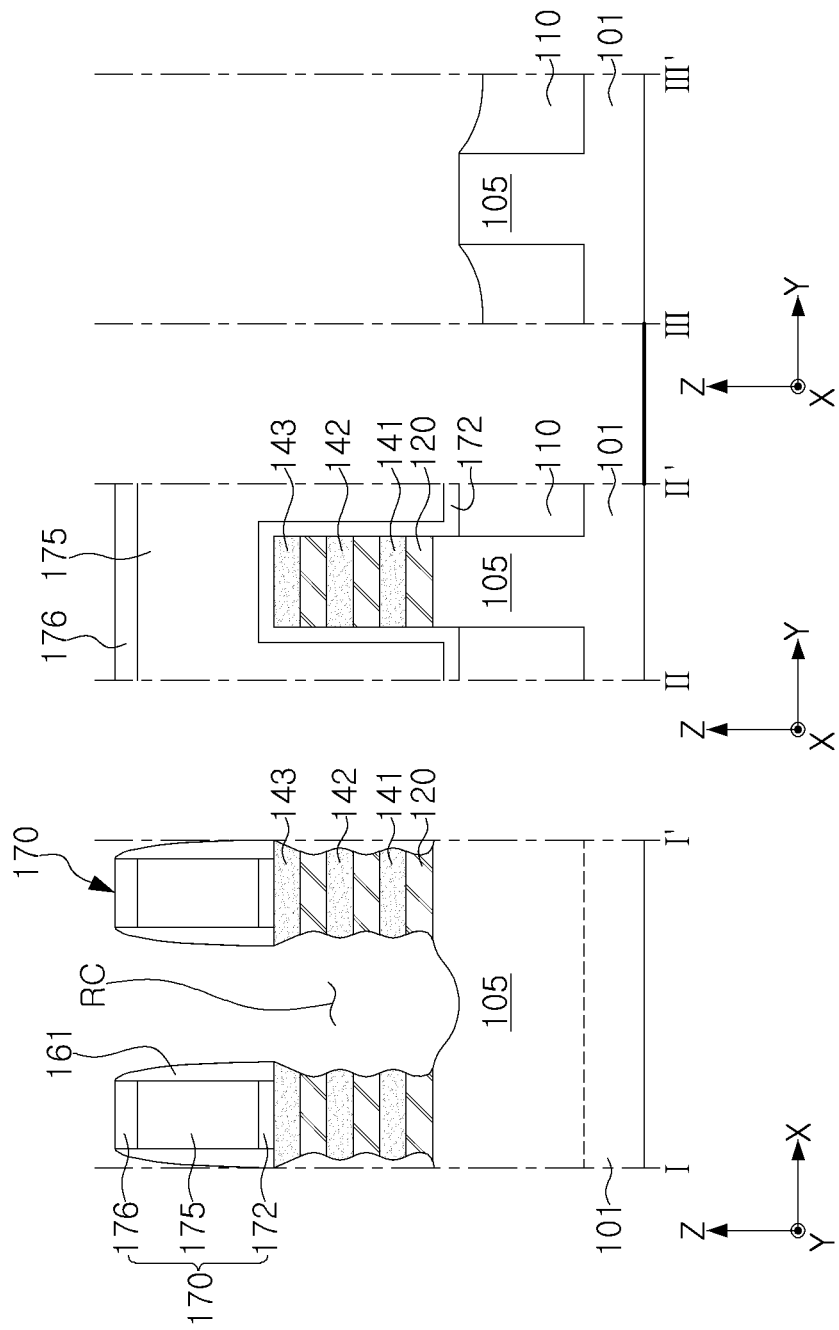

The internal spacer layers 130 may be formed in a region in which the sacrificial layers 120 are removed before the first epitaxial layer 151 is formed (see FIG. 11D). The internal spacer layers 130 may be formed by filling an insulating material in the region, in which the sacrificial layers 120 (shown in FIG. 11D) are removed, and removing the insulating material deposited on an outside of the channel structures 140. The internal spacer layers 130 may be formed of the same material as the spacer layers 161, but example embodiments are not limited thereto. For example, the internal spacer layers 130 may include at least one of SiN, SiCN, SiOCN, SiBCN, and SiBN.

The internal spacer layers 130 may also be applied to other example embodiments. According to an example embodiment, unlike the source/drain region 150 illustrated in FIG. 7, the source/drain region 150 illustrated in FIG. 4A may be applied while the internal spacer layers 130 remains.

Referring to FIGS. 8A and 8B, a thickness of each of the doping layers 153 of the semiconductor device 100e may be different from each other. A thickness T1 of the lowermost portion of the doping layers 153 may be less than a thickness T2 of the uppermost portion, for example, the thickness of each of the doping layers 153 may be gradually increased in a Z-direction (e.g., a vertical direction). In this case, a contact area between the metal-semiconductor compound layer 182 of the contact plug 180 and the doping layers 153 may be increased to reduce contact resistance. Accordingly, performance of a semiconductor device may be improved. However, the number, location, order, and the like, of a layer having a highest thickness and a layer having a lowest thickness, among the doping layers 153, may vary according to example embodiments.

Figure 9:
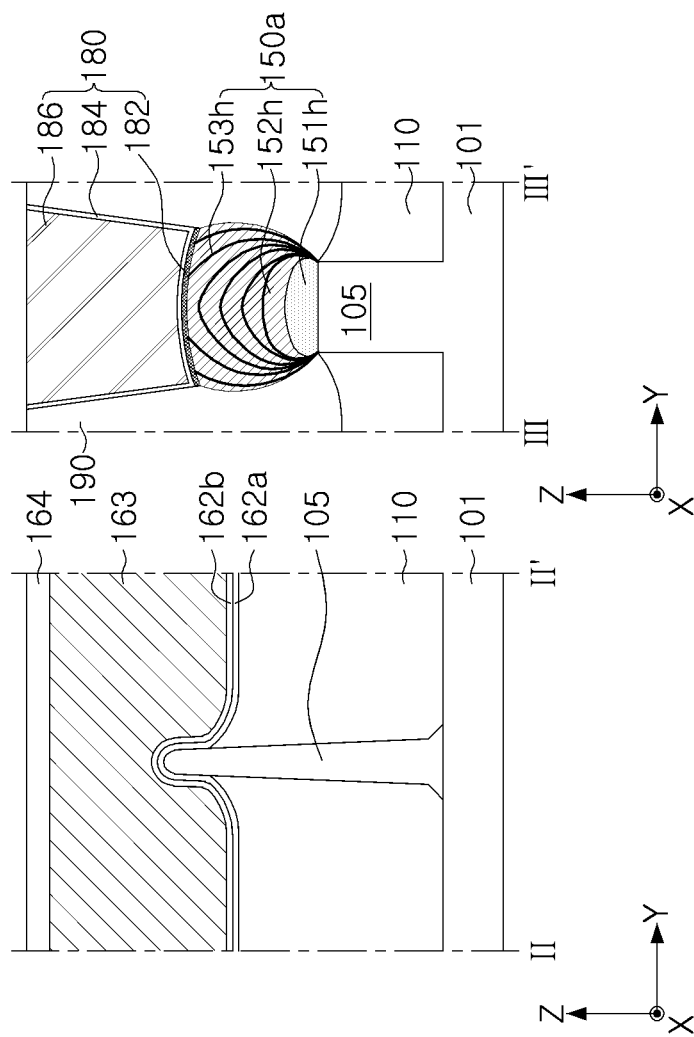
FIGS. 9 and 10 are cross-sectional views illustrating a semiconductor device according to example embodiments.
Figure 9:
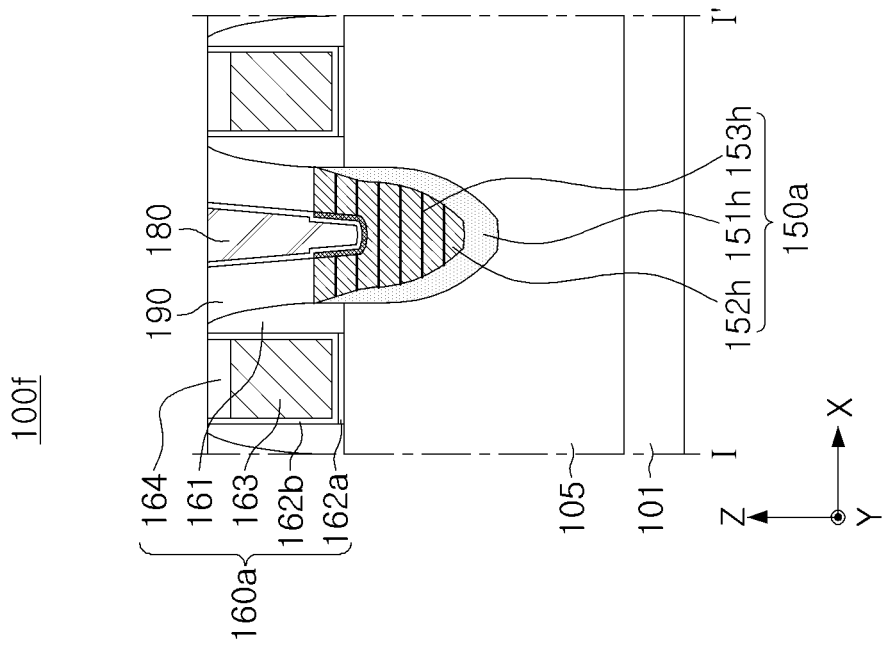
Figure 10:
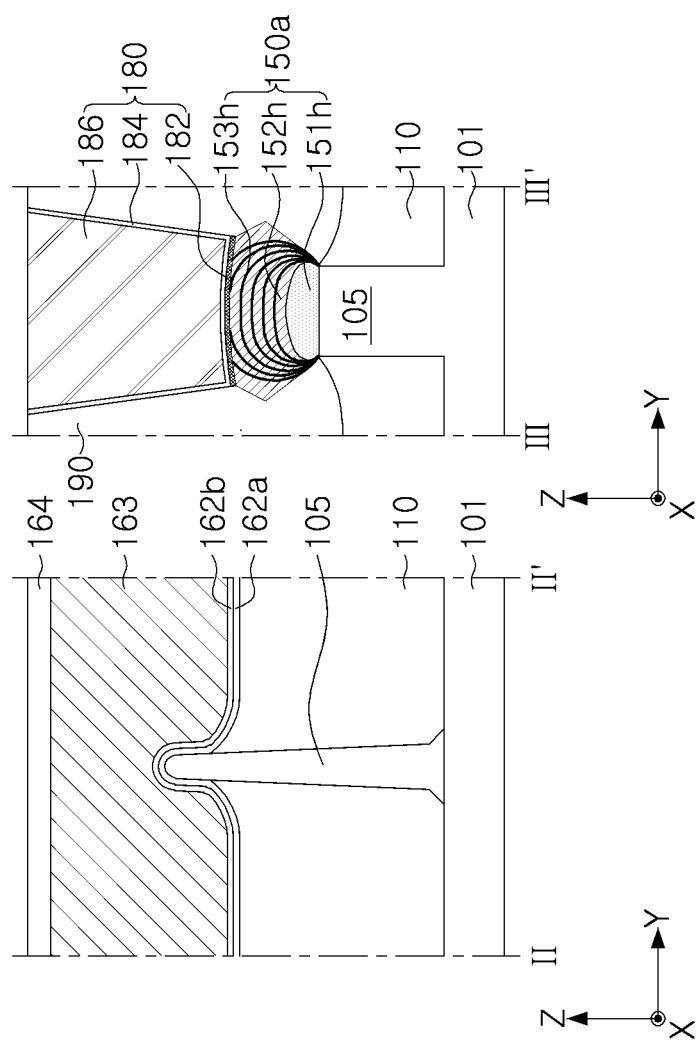

FIGS. 9 and 10 are cross-sectional views illustrating semiconductor devices 100f and 100g according to example embodiments.

In FIGS. 9 and 10, the same reference numerals as those in FIG. 2A denote corresponding elements, and redundant descriptions will be omitted. In FIGS. 9 and 10, elements having the same reference numerals as those of FIG. 2A but having different alphabets will be provided to describe an example embodiment different from the example embodiment of FIG. 2A, and the features described with the same reference numbers described above may be the same as each other.

Referring to FIGS. 9 and 10, the semiconductor devices 100f and 100g may include a substrate 101, an active region 105, an isolation layer 110, source/drain regions 150a, and gate structures 160a, contact plugs 180, and an interlayer insulating layer 190. Each of the semiconductor devices 100f and 100g may include FinFET devices, transistors in which the active region 105 has a fin structure. The FinFET devices may include transistors arranged based on an active region 105 and gate structures 160a intersecting each other. For example, the transistors may be NMOS transistors or PMOS transistors.

The source/drain regions 150a may be disposed on opposite sides of the gate structures 160a and on recess regions in which the active region 105 is recessed. The recess region may extend in an X-direction between the gate structures 160a, and may have internal walls disposed opposite ends in the X-direction and a bottom surface between the internal walls. The source/drain regions 150a may be provided as a source region or a drain region of a transistor. Upper surfaces of the source/drain regions 150a may be disposed at a level higher than or similar to a level of a lower surface of the gate structures 160a, as illustrated in FIGS. 9 and 10. However, the relative heights of the source/drain regions 150a and the gate structures 160a may vary according to example embodiments. For example, the source/drain regions 150a may have an elevated source/drain shape in which upper surfaces thereof are disposed to be higher than lower surfaces of the gate structures 160a, for example, the gate electrode layer 163, but example embodiments are not limited thereto.

The source/drain regions 150a may include first epitaxial layer 151h, a second epitaxial layer 152h, and doping layers 153h, formed by doping the second epitaxial layers 152h, sequentially stacked. Both the first epitaxial layer 151h and the second epitaxial layers 152h may include silicon (Si), and may include impurities of different elements and/or concentrations. However, the number of epitaxial layers constituting the source/drain region 150a may vary according to example embodiments.

FIGS. 9 and 10 illustrate only a structure in which the first epitaxial layer 151h is present, it will be appreciated that the example embodiment of FIGS. 5 and 6 may also be applied to the source/drain region 150a of FIGS. 9 and 10, respectively.

Gate structures 160a may be disposed on an active region 105 to intersect the active region 105 and extend in one direction, for example, a Y-direction. Channel regions of transistors may be formed in the active region 105 intersecting the gate structures 160a. For example, "channel region" may refer to a region including a depletion region of a transistor and a region intersecting the gate structures 160a in the active region 105 and adjacent to the gate structures 160a. The gate structure 160a may include first and second gate dielectric layers 162a and 162b, a gate electrode layer 163, spacer layers 161, and a gate capping layer 164.

The first and second gate dielectric layers 162a and 162b may be disposed between the active region 105 and the gate electrode layer 163, and the first gate dielectric layer 162a may be disposed on a lower surface of the second gate dielectric layer 162b on a lower surface of the gate electrode layer 163 and the second gate dielectric layer 162b may be disposed to cover a lower surface and opposite side surfaces of the gate electrode layer 163. In example embodiments, one of the first and second gate dielectric layers 162a and 162b may be omitted. Each of the first and second gate dielectric layers 162a and 162b may include an oxide, a nitride, or a high-k dielectric material. The high-k dielectric material may refer to a dielectric material having a dielectric constant, higher than a dielectric constant of a silicon oxide layer ($SiO_2$). The high-k dielectric constant material may be one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode layer 163 may be disposed to be divided between at least some transistors, among transistors adjacent to each other, depending on a configuration of the semiconductor devices 100f and 100g.

The spacer layers 161 may be disposed on opposite side surfaces of the gate electrode layer 163. The spacer layers 161 may insulate the source/drain regions 150a and the gate electrode layer 163 from each other. In example embodiments, the spacer layers 161 may have a multilayer structure. The spacer layers 161 may be formed of an oxide, a nitride, or an oxynitride, for example, a low-k dielectric material.

The gate capping layer 164 may be disposed on the gate electrode layer 163, and may have a lower surface and side surfaces, respectively surrounded by the gate electrode layer 163 and the spacer layers 161.

FIGS. 11A to 11K are cross-sectional views for sequentially describing a method of fabricating a semiconductor device according to example embodiments. FIGS. 11A to 11K illustrate example embodiments of a method of fabricating the semiconductor device 100 of FIGS. 1 and 2A, and illustrate cross-sections corresponding to FIG. 2A.

Referring to FIG. 11A, sacrificial layers 120 and a plurality of channel layers 141, 142, and 143 may be alternately stacked on a substrate 101.

The sacrificial layers 120 may be replaced with the gate dielectric layer 162 and the gate electrode layer 163 through a subsequent process, as illustrated in FIG. 2A. Each of the sacrificial layers 120 may be formed of a material having etching selectivity with respect to the plurality of channel layers 141, 142, and 143. Each of the plurality of channel layers 141, 142, and 143 may include a material, different from a material of the sacrificial layers 120. In an example embodiment, each of the plurality of channel layers 141, 142, and 142 may include silicon (Si), and the sacrificial layers 120 may include silicon-germanium (SiGe).

The sacrificial layers 120 and the plurality of channel layers 141, 142, and 143 may be formed by performing an epitaxial growth process using the substrate 101 as a seed. Each of the sacrificial layers 120 and the plurality of channel layers 141, 142, and 143 may have a thickness ranging from about 1 angstrom (Å) to about 100 nm. The number of the plurality of channel layers 141, 142, and 143, stacked alternately with the sacrificial layer 120, may vary according to example embodiments.

Referring to FIG. 11B, a portion of a stack structure of the sacrificial layers 120 and the plurality of channel layers 141, 142, and 143 and a portion of the substrate 101 may be removed to form active structures.

The active structure may include the sacrificial layers 120 and the plurality of channel layers 141, 142, and 143 stacked alternately, and may further include an active region 105 formed to protrude to an upper surface of the substrate 101 by removing a portion of the substrate 101. The active structures may be formed to have a line shape extending in one direction, for example, an X-direction, and may be disposed to be spaced apart from each other in a Y-direction.

In a region in which a portion of the substrate 101 is removed, isolation layers 110 may be formed by filling the insulating material and then recessing the active region 105 to protrude. An upper surface of the isolation layers 110 may be formed to be lower than an upper surface of the active region 105.

Referring to FIG. 11C, sacrificial gate structures 170 and spacer layers 161 may be formed on the active structures.

The sacrificial gate structures 170 may be sacrificial structures formed in a region in which a gate dielectric layer 162 and a gate electrode layer 163 are disposed on the channel structure 140 through a subsequent process, as illustrated in FIG. 2A. The sacrificial gate structures 170 may include first and second sacrificial gate layers 172 and 175 and a mask pattern layer 176 stacked sequentially. The first and second sacrificial gate layers 172 and 175 may be patterned using a mask pattern layer 176. The first and second sacrificial gate layers 172 and 175 may be an insulating layer and a conductive layer, respectively. For example, the first sacrificial gate layer 172 may include a silicon oxide, and the second sacrificial gate layer 175 may include polysilicon. The mask pattern layer 176 may include s silicon nitride. The sacrificial gate structures 170 may have a line shape intersecting the active structures and extending in one direction. The sacrificial gate structures 170 may extend, for example, in a Y-direction and may be disposed to be spaced apart from each other in an X-direction.

The spacer layers 161 may be formed on opposite sidewalls of the sacrificial gate structures 170. The spacer layers 161 may be formed by forming a layer having a uniform thickness along upper and side surfaces of the sacrificial gate structures 170 and the active structures and then anisotropically etching the layer. The spacer layers 161 may be formed of a low-k dielectric material, and may include at least one of, for example, SiO, SiN, SiCN, SiOC, SiON, and SiOCN.

Referring to FIG. 11D, a recess region RC may be formed by removing the exposed sacrificial layers 120 and the exposed channel layers 141, 142, and 143 between the sacrificial gate structures 170, and thus, a channel structures 140 may be formed.

The exposed sacrificial layers 120 and the exposed channel layers 141, 142, and 143 may be removed using the sacrificial gate structures 170 and the gate spacer layers 161 as masks. Remaining sacrificial layers 120 may be selectively etched with respect to the channel structures 140 by, for example, a wet etching process to be removed from the side surface in an X-direction by a predetermined depth to have inwardly concave side surfaces. Remaining channel layers 141, 142, and 143 may have inwardly convex side surface by etching side surfaces thereof in the X-direction. However, shapes of the side surfaces of the sacrificial layers 120 and the plurality of channel layers 141, 142, and 143 are not limited to the illustrated shapes. The side surfaces of the sacrificial layers 120 and the plurality of channel layers 141, 142, and 143 may be formed to be coplanar with each other in a direction, perpendicular to the upper surface of the substrate 101.

Figure 11E:
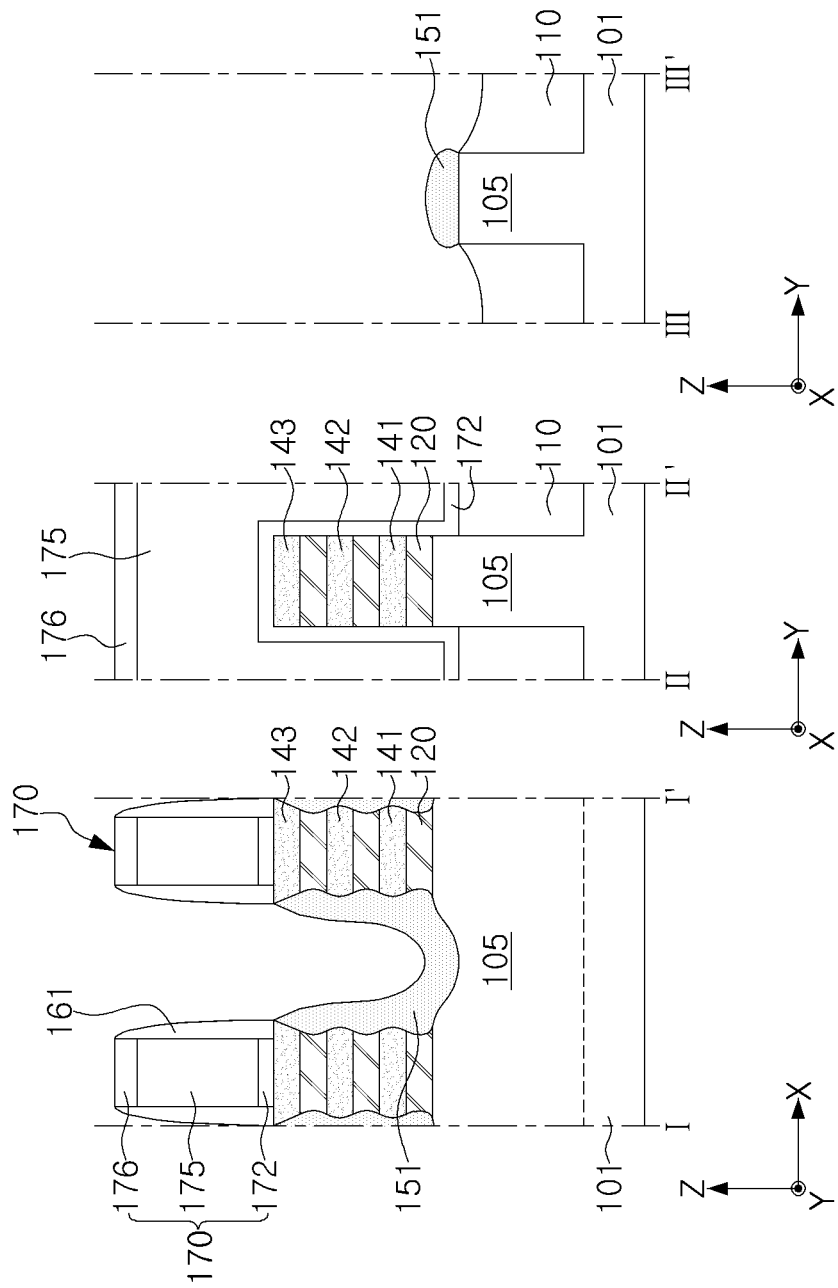

Referring to FIG. 11E, a first epitaxial layer 151 may be formed in the recess region RC.

The source/drain regions 150 may be formed by an appropriate epitaxial growth process. The first epitaxial layer 151 may be formed by epitaxial growth, and may extend to contact the plurality of channel layers 141, 142, 143 and the sacrificial layers 120 in the recess region RC. Accordingly, an upper surface of the first epitaxial layer 151 may be formed in a recessed shape, and may be formed to have a substantially U shape. A surface, on which the first epitaxial layer 151 contacts the plurality of channel layers 141, 142, 143 and the sacrificial layers 120, may have a wavy shape. The first epitaxial layer 151 may include impurities by in-situ doping.

Figure 11F:
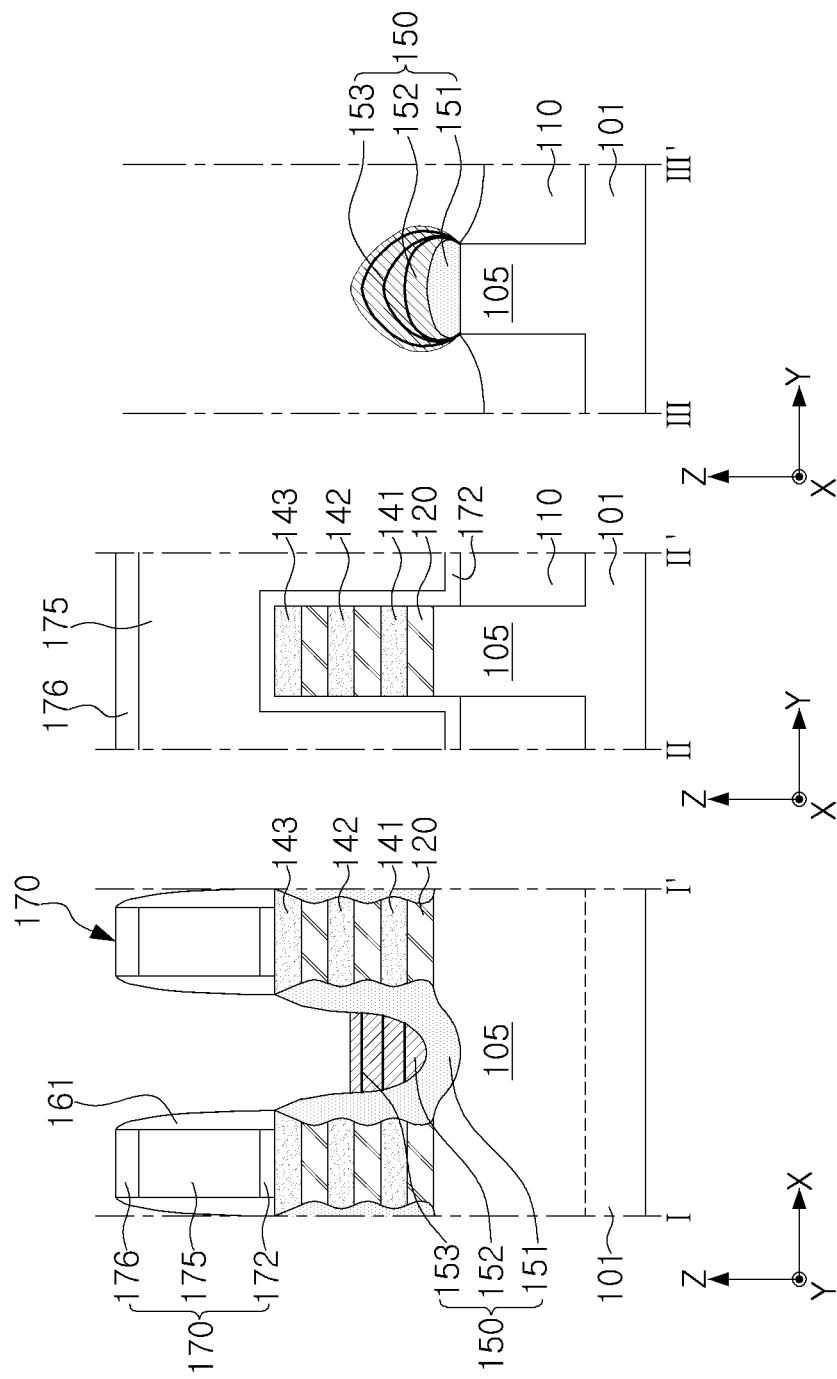

Referring to FIG. 11F, second epitaxial layers 152 and doping layers 153 may be formed on the first epitaxial layer 151.

The second epitaxial layers 152 may include silicon-germanium (SiGe) doped with a group III element. The second epitaxial layers 152 may include one of boron (B), aluminum (Al), gallium (Ga), indium (In), and thallium (Tl) as a doping element. The second epitaxial layers 152 may include germanium (Ge) having a concentration higher than a concentration of the first epitaxial layer 151. The second epitaxial layers 152 may be grown from the first epitaxial layer 151 and the active region 105 by selective epitaxial growth (SEG), and may be an in-situ doped semiconductor layer. A doped-impurity concentration of the second epitaxial layers 152 may have a range of about $1 \times 10^{17}$ atoms/cm$^3$ to about $5 \times 10^{21}$ atoms/cm$^3$.

According to an example embodiment, when the second epitaxial layers 152 are formed under the conditions that a temperature ranges from about 500° C. to about 800° C. and a pressure is about 100 Torr or less, the first epitaxial layer 151 is not formed on a side surface of the first epitaxial layer 151 but may be formed on only a lower end portion of the first epitaxy layer 151. Each of the second epitaxial layers 152 may be formed to have a thickness ranging from about 1 nm to about 10 nm, and may be formed in a state in which silicon (Si) or germanium (Ge) is not included or a content thereof is significantly reduced.

The doping layers 153 may be formed by doping impurities through in-situ doping while forming the second epitaxial layers 152. Each of the doping layers 153 may have a thickness of about 0.1 nm to about 5 nm. An impurity concentration of the doping layers 153 may have a range of about $1 \times 10^{19}$ atoms/cm$^3$ to about $1 \times 10^{22}$ atoms/cm$^3$, and may be higher than an impurity concentration of the second epitaxial layers 152. Respective second epitaxial layers 152 and respective doping layers 153 may be alternately stacked by periodically performing in-situ doping In the case of the example embodiments of FIGS. 4A and 4B, the second epitaxial layers 152 may be formed under conditions that a temperature ranges from about 300° C. to about 600° C. and a pressure is about 500 Torr or less. Among the second epitaxial layers 152, a lowermost second epitaxial layer 152 may be conformally formed to cover an entire internal side surface of the first epitaxial layer 151 and to have a substantially uniform thickness. Accordingly, upper surfaces of the second epitaxial layers 152 may have a recessed shape, similar to that of the first epitaxial layer 151. The second epitaxial layers 152 may be formed to cover the entire upper surface of the first epitaxial layer 151. In this case, each of the second epitaxial layers 152 may be formed to have a thickness ranging from about 1 nm to about 10 nm. Even in the case of the example embodiment of FIGS. 4A and 4B, the doping layers 153 may be formed by in-situ doping as described above.

Figure 11G:
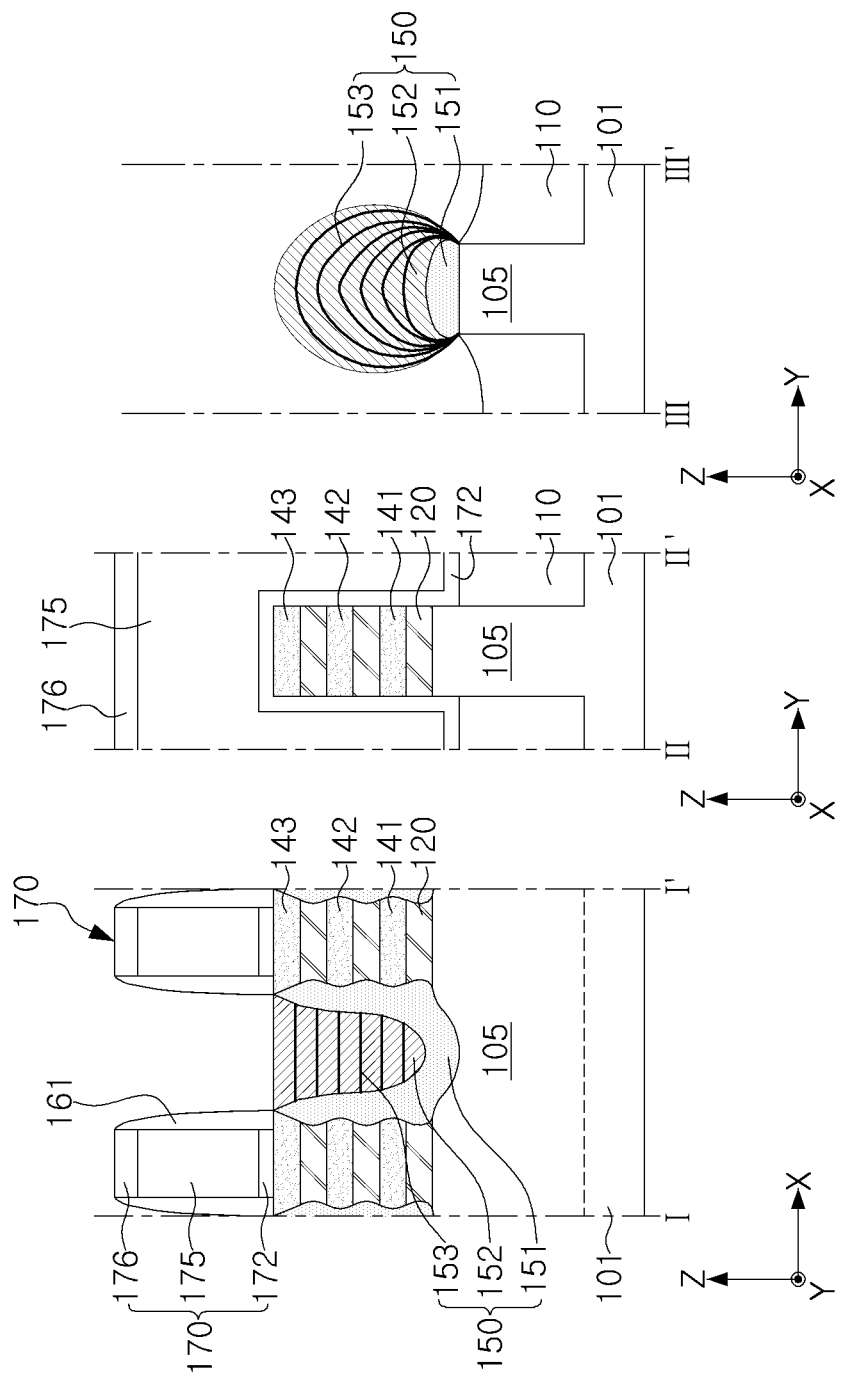

Referring to FIG. 11G, a source/drain region 150 may be formed to fill the recess region RC.

The second epitaxial layers 152 and the doping layers 153 may constitute a superlattice structure. Two to twenty doping layers 153 may be provided, and an impurity concentration of the doping layers 153 may be higher than an impurity concentration of the second epitaxial layers 152. Accordingly, the source/drain region 150 may be finally formed.

According to the example embodiment of FIG. 2A, an example of a superlattice structure in which seven second epitaxial layers 152 and six doping layers 153 are alternately stacked is disclosed. However, the number of the second epitaxial layers 152 and the doping layers 153 is not limited thereto.

In the source/drain region 150, the first epitaxial layer and the second epitaxial layers 151 and 152 and the doping layers 153 may all be formed by performing an epitaxial growth process. Therefore, in the finally formed source/drain region 150, boundaries between the first epitaxial layer 151 and the second epitaxial layers 152, and the doping layers 153 may not be recognized in an electron microscope image. Even in this case, the first epitaxial layer 151, the second epitaxial layers 152, and the doping layers 153 have different material compositions, so that impurity concentrations may be analyzed through analysis such as transmission electron microscopy energy-dispersive X-ray spectroscopy (TEM-EDX) to distinguish the first epitaxial layer 151, the second epitaxial layers 152, and the doping layers 153 from each other.

Figure 11H:
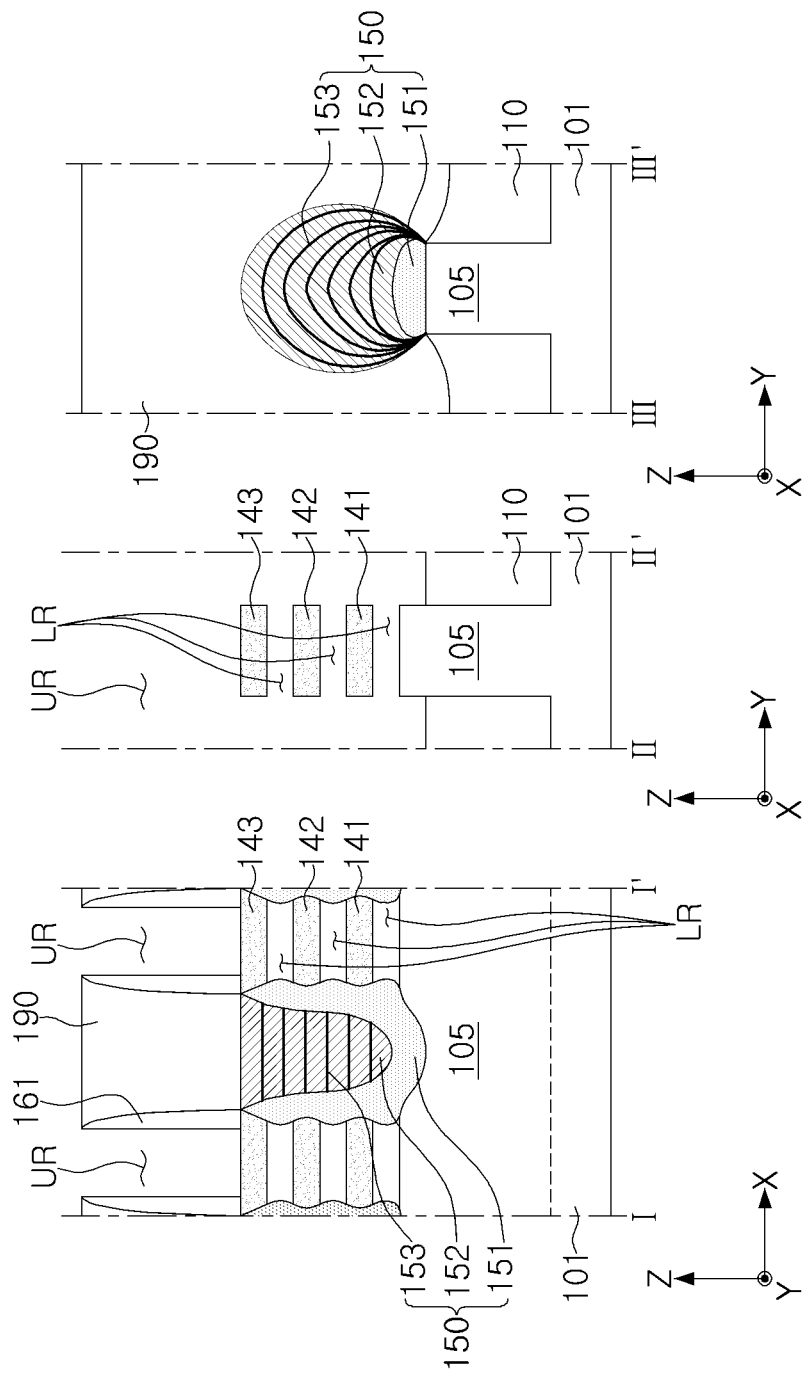

Referring to FIG. 11H, an interlayer insulating layer 190 may be formed, and the sacrificial layers 120 and the sacrificial gate structures 170 may be removed.

The interlayer insulating layer 190 may be formed by forming an insulating layer to cover the sacrificial gate structures 170 and the source/drain regions 150 and then performing a planarization process thereon.

The sacrificial layers 120 and the sacrificial gate structures 170 may be selectively removed with respect to the spacer layers 161, the interlayer insulating layer 190, and the plurality of channel layers 141, 142, and 143. The sacrificial gate structures 170 may be removed to form upper gap regions UR, and the sacrificial layers 120 exposed through the upper gap regions UR may then be removed to form lower gap regions LR. For example, when the sacrificial layers 120 include silicon-germanium (SiGe) and the plurality of channel layers 141, 142, and 143 include silicon (Si), the sacrificial layers 120 may be selectively removed by performing a wet etching process using peracetic acid as an etchant. During the removal process, the source/drain regions 150 may be protected by the first epitaxial layer 151 formed in an outermost portion and having low etching selectivity.

Figure 11I:
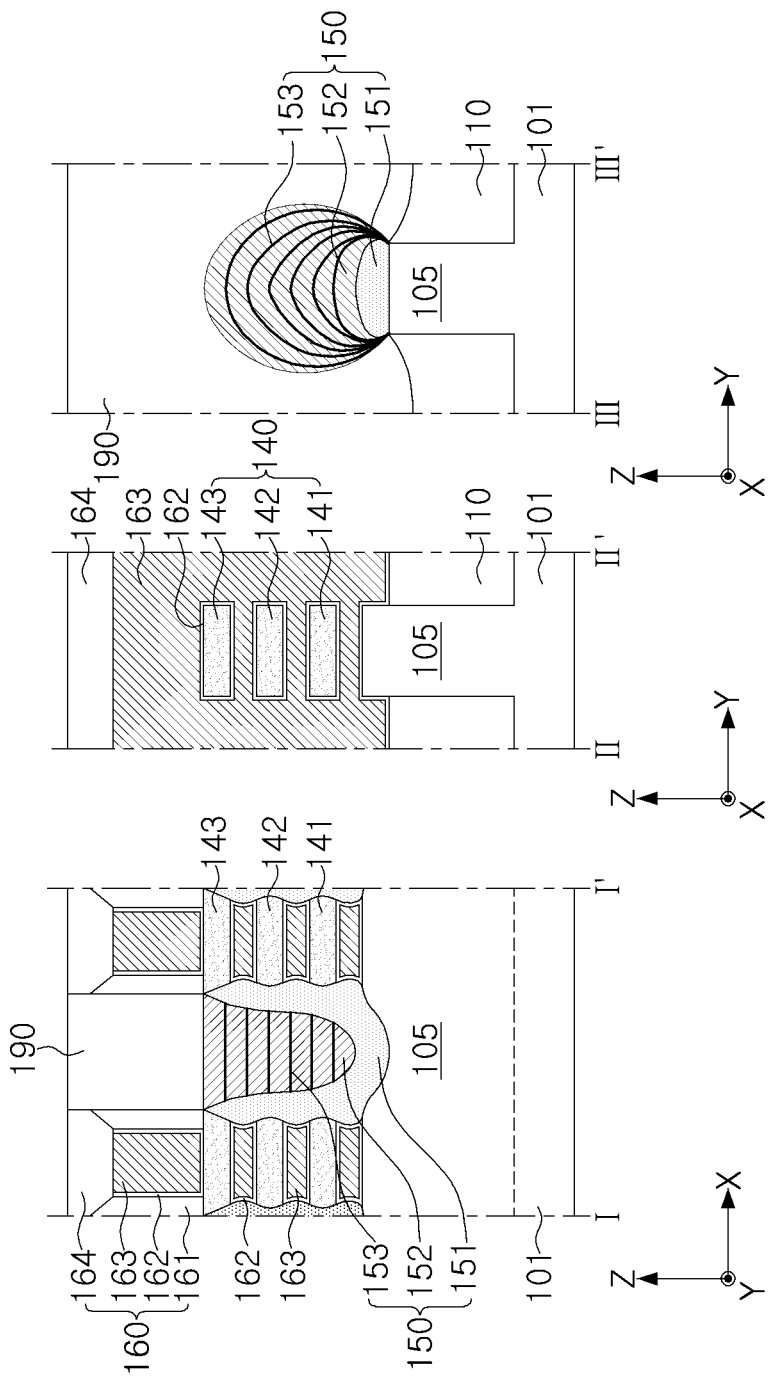

Referring to FIG. 11I, a gate structure 160 may be formed in the upper gap regions UR and the lower gap regions LR.

The gate dielectric layer 162 may be formed to conformally cover internal surfaces of the upper gap regions UR and the lower gap regions LR. The gate electrode layer 163 may be formed to completely fill the upper gap regions UR and the lower gap regions LR. The gate electrode layer 163 and the spacer layers 161 may be removed from an upper portion thereof in the upper gap regions UR by a predetermined depth. In the upper gap regions UR, a gate capping layer 164 may be formed in a region in which the gate electrode layer 163 and the spacer layers 161 are removed. Accordingly, a gate structure 160 including the gate dielectric layer 162, the gate electrode layer 163, the spacer layers 161, and the gate capping layer 164 may be formed.

Figure 11J:
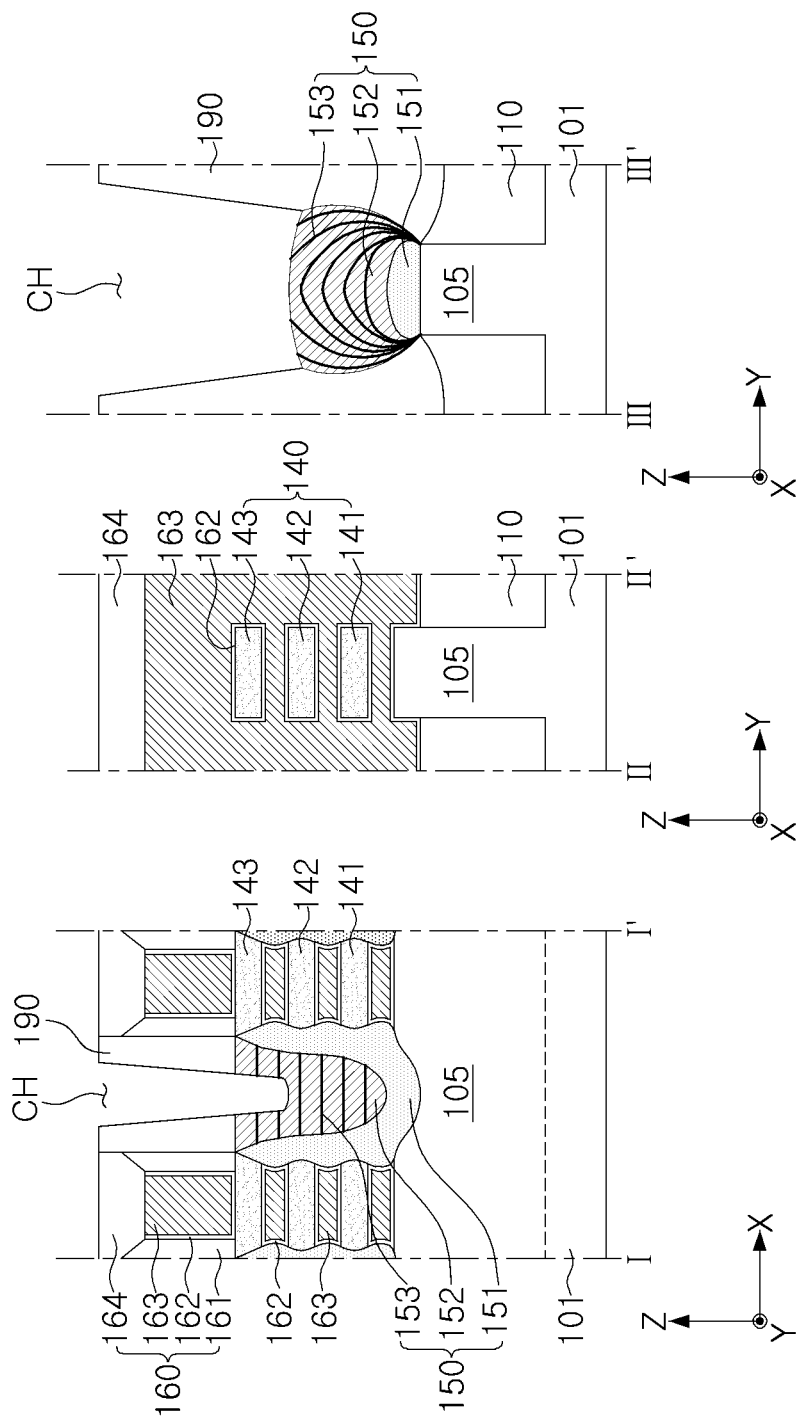
Figure 11K:
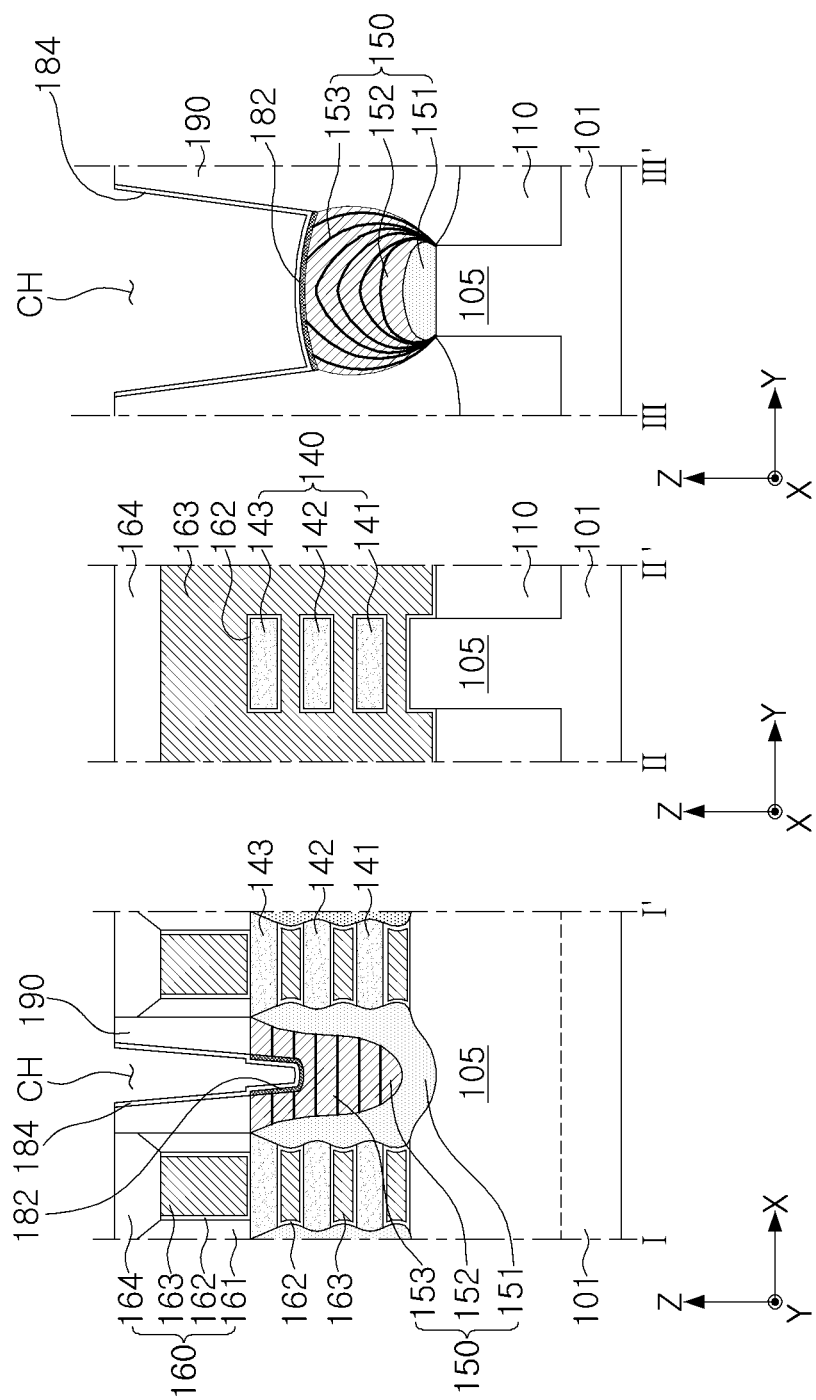

Referring to FIGS. 11J and 11K, a contact plug 180 may be formed.

As illustrated in FIG. 11J, contact holes CH may be formed to expose the source/drain regions 150. Lower surfaces of the contact holes CH may be recessed inwardly of the source/drain regions 150.

As illustrated in FIG. 11K, a material forming the barrier layer 184 may be deposited, and the same process as the silicide process may then be performed to form a metal-semiconductor compound layer 182 on the bottom surfaces of the contact holes CH.

Referring to FIG. 2A, a conductive material may be deposited to fill the contact holes CH, so that a pug conductive layer 186 may be formed. By the present operation, contact plugs 180 including the metal-semiconductor compound layer 182, the barrier layer 184, and the plug conductive layer 186 may be formed.

According to an example embodiment, the contact plug 180 may be formed to penetrate through the second epitaxial layers 152 and to contact at least a portion of the doping layers 153. In this case, the metal-semiconductor compound layer 182 of the contact plug 180 may contact a portion of the doping layers 153, and a lower end of the metal-semiconductor compound layer 182 may be disposed at a level lower than a level of the upper end of the plurality of channel layers 141, 142, and 143. However, a shape and a disposition of the contact plug 180 are not limited thereto, and may vary.

As described above, in a source/drain region, a contact plug may contact the doping layers via a superlattice structure of epitaxial layers and doping layers. Thus, a semiconductor device having improved electrical characteristics may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
an active region extending in a first direction on a substrate;
a plurality of channel layers disposed to be spaced apart from each other in a vertical direction, perpendicular to an upper surface of the substrate, on the active region;
a gate structure extending in a second direction perpendicular to the first direction to intersect the active region and the plurality of channel layers on the substrate and surrounding each of the plurality of channel layers;
a source/drain region disposed on the active region on at least one side of the gate structure and contacting the plurality of channel layers; and
a contact plug connected to the source/drain region,
wherein the source/drain region comprises:
a first epitaxial layer disposed on the active region and extending to contact the plurality of channel layers;
second epitaxial layers disposed on the first epitaxial layer, each second epitaxial layer including impurities in a first concentration and having a first thickness; and
doping layers stacked alternately with the second epitaxial layers, each doping layer including impurities in a second concentration higher than the first concentration and having a second thickness less than the first thickness,
wherein side surfaces of each of the second epitaxial layers and each of the doping layers contact the first epitaxial layer, and
wherein the contact plug contacts at least a portion of the doping layers.

2. The semiconductor device of claim 1, wherein the impurities include at least one of phosphorus (P), arsenic (As), boron (B), gallium (Ga), antimony (Sb), aluminum (Al), thallium (Tl), and indium (In).

3. The semiconductor device of claim 1, wherein each of the doping layers has a first resistivity, and each of the second epitaxial layers has a second resistivity higher than the first resistivity.

4. The semiconductor device of claim 1, wherein the second concentration is about $1\times10^{19}$ atoms/cm$^3$ to about $1\times10^{22}$ atoms/cm$^3$.

5. The semiconductor device of claim 1, wherein each of the second epitaxial layers includes germanium (Ge).

6. The semiconductor device of claim 5, wherein some of the second epitaxial layers have different concentrations of germanium (Ge).

7. The semiconductor device of claim 1, wherein the second thickness is about 0.1 nm to about 5 nm.

8. The semiconductor device of claim 1, wherein the doping layers include two to twenty doping layers included in the source/drain region.

9. The semiconductor device of claim 1, wherein the contact plug includes a metal-semiconductor compound layer, and
wherein the metal-semiconductor compound layer contacts a portion of the doping layers.

10. The semiconductor device of claim 9, wherein a lower end of the metal-semiconductor compound layer is disposed at a level lower than a level of an upper end of the plurality of channel layers.

11. The semiconductor device of claim 1, wherein each of the second epitaxial layers and each of the doping layers extend horizontally with respect to the upper surface of the substrate in the first direction.

12. The semiconductor device of claim 1, wherein the active region has a recess region recessed from an upper surface of the recess region on at least one side of the gate structure, and
wherein the first epitaxial layer is conformally disposed along an internal side surface of the recess region.

13. A semiconductor device comprising:
an active region extending in a first direction on a substrate;
a plurality of channel layers disposed to be spaced apart from each other in a vertical direction, perpendicular to an upper surface of the substrate, on the active region;
a gate structure intersecting the active region and the plurality of channel layers, and extending in a second direction perpendicular to the first direction on the substrate, and surrounding each of the plurality of channel layers;
a source/drain region disposed on the active region on at least one side of the gate structure and contacting the plurality of channel layers; and
a contact plug connected to the source/drain region,
wherein the source/drain region comprises:
a first epitaxial layer disposed on the active region and extending to contact the plurality of channel layers;
second epitaxial layers disposed on the first epitaxial layer, each second epitaxial layer including impurities in a first concentration and having a first thickness; and
doping layers stacked alternately with the second epitaxial layers, each doping layer including the impurities in a second concentration and having a second thickness less than the first thickness, wherein among the second epitaxial layers, the lowermost second epitaxial layer covers an entire internal side surface of the first epitaxial layer, and wherein the contact plug contacts at least a portion of the doping layers.

14. The semiconductor device of claim 13, wherein concentrations of the impurities in the second epitaxial layers are the same as each other.

15. The semiconductor device of claim 13, wherein each of the second epitaxial layers and the doping layers has a downwardly convex shape in the first direction.

16. The semiconductor device of claim 15, wherein the active region includes a recess region recessed from an upper surface of the recess region on at least one side of the gate structure, and wherein each of the first epitaxial layer, the second epitaxial layers, and the doping layers is conformally disposed along an internal side surface of the recess region.

17. The semiconductor device of claim 13, wherein the contact plug includes a metal-semiconductor compound layer, and wherein the metal-semiconductor compound layer contacts some doping layers, among the doping layers.

18. The semiconductor device of claim 17, wherein the metal-semiconductor compound layer further contacts at least a portion of the second epitaxial layers.

19. A semiconductor device comprising:
an active region extending in a first direction on a substrate;
a gate structure intersecting the active region and extending in a second direction perpendicular to the first direction on the substrate;
a source/drain region disposed on the active region on at least one side of the gate structure; and
a contact plug connected to the source/drain region,
wherein the source/drain region comprises:
epitaxial layers each having a first thickness; and
doping layers stacked alternately with the epitaxial layers, each doping layer including at least one of phosphorus (P), arsenic (As), boron (B), gallium (Ga), antimony (Sb), aluminum (Al), thallium (Tl), and indium (In) in an impurity concentration of about $1 \times 10^{19}$ atoms/cm$^3$ to about $1 \times 10^{22}$ atoms/cm$^3$ and having a second thickness less than the first thickness, and
wherein the contact plug contacts at least a portion of the doping layers.

20. The semiconductor device of claim 19, wherein the impurity concentration of each of the doping layers is higher than an impurity concentration of each of the epitaxial layers.

* * * * *